(12) United States Patent
Tsai et al.

(10) Patent No.: US 9,461,209 B2
(45) Date of Patent: Oct. 4, 2016

(54) SEMICONDUCTOR LIGHT-EMITTING DEVICE

(71) Applicant: Epistar Corporation, Hsinchu (TW)

(72) Inventors: Min-Yen Tsai, Hsinchu (TW); Chao-Hsing Chen, Hsinchu (TW); Tsung-Hsun Chiang, Hsinchu (TW); Wen-Hung Chuang, Hsinchu (TW); Bo-Jiun Hu, Hsinchu (TW); Tzu-Yao Tseng, Hsinchu (TW); Jia-Kuen Wang, Hsinchu (TW); Kuan-Yi Lee, Hsinchu (TW); Yi-Ming Chen, Hsinchu (TW); Chun-Yu Lin, Hsinchu (TW); Tsung-Hsien Yang, Hsinchu (TW); Tzu-Chieh Hsu, Hsinchu (TW); Kun-De Lin, Hsinchu (TW); Yao-Ning Chan, Hsinchu (TW); Chih-Chiang Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/853,511

(22) Filed: Sep. 14, 2015

(65) Prior Publication Data

US 2016/0005941 A1   Jan. 7, 2016

Related U.S. Application Data

(63) Continuation-in-part of application No. 14/554,488, filed on Nov. 26, 2014, now Pat. No. 9,337,394.

(30) Foreign Application Priority Data

Nov. 27, 2013 (TW) .............................. 102143409 A
Jun. 6, 2014 (TW) .............................. 103119845 A
Jul. 11, 2014 (TW) .............................. 103124091 A

(51) Int. Cl.
*H01L 33/00* (2010.01)
*H01L 33/38* (2010.01)
*H01L 33/22* (2010.01)
*H01L 33/46* (2010.01)

(52) U.S. Cl.
CPC ............. *H01L 33/382* (2013.01); *H01L 33/22* (2013.01); *H01L 33/46* (2013.01); *H01L 2224/48091* (2013.01); *H01L 2224/73265* (2013.01)

(58) Field of Classification Search
CPC ...... H01L 33/382; H01L 33/22; H01L 33/46
See application file for complete search history.

(56) References Cited

U.S. PATENT DOCUMENTS

| 8,933,480 B2 | 1/2015 | Akimoto et al. |
| 2012/0032218 A1 | 2/2012 | Choi et al. |
| 2012/0074441 A1 | 3/2012 | Seo et al. |

*Primary Examiner* — Fernando L Toledo
*Assistant Examiner* — Neil Prasad
(74) *Attorney, Agent, or Firm* — Muncy, Geissler, Olds & Lowe, P.C.

(57) ABSTRACT

A semiconductor light-emitting device includes a semiconductor stack comprising a first semiconductor layer, a second semiconductor layer, and an active layer between the first semiconductor layer and the second semiconductor layer, wherein the first semiconductor layer includes a periphery surface surrounding the active layer; a plurality of vias penetrating the semiconductor stack to expose the first semiconductor layer; and a patterned metal layer formed on the plurality of vias and covered the periphery surface of the first semiconductor layer.

20 Claims, 20 Drawing Sheets

SEMICONDUCTOR LIGHT-EMITTING DEVICE

REFERENCE TO RELATED APPLICATION

This application is a continuation-in-part application of U.S. patent application Ser. No. 14/554,488, filed on Nov. 26, 2014, now pending, and which claims the right of priority based on TW Application Serial No. 102143409, filed on Nov. 27, 2013; TW Application Serial No. 103119845, filed on Jun. 6, 2014; TW Application Serial No. 103124091, filed on Jul. 11, 2014, and the content of which are hereby incorporated by reference in their entireties.

TECHNICAL FIELD

The application relates to a structure of a semiconductor light-emitting device, and more particularly, to a semiconductor light-emitting device comprising a conductive via.

DESCRIPTION OF BACKGROUND ART

Light-emitting diode (LED) is widely applied to optical display apparatus, traffic lights, data storage apparatus, communication apparatus, lighting apparatus, and medical equipment. As shown in FIG. 7, a conventional LED includes an n-type semiconductor layer 1104, an active layer 1106, and a p-type semiconductor layer 1108 sequentially formed on a substrate 1102. Portions of the p-type semiconductor layer 1108 and the active layer 1106 are removed to expose a portion of the n-type semiconductor layer 1104. A p-type electrode a1 and an n-type electrode a2 are formed on the p-type semiconductor layer 1108 and the n-type semiconductor layer 1104 respectively. Because the n-type electrode a2 requires a sufficient surface for following process such as wire bonding, a substantial portion of the active layer 1106 has to be removed and the light extraction efficiency is therefore lowered.

Furthermore, the LED described above can be connected with other devices to form a light-emitting apparatus. FIG. 6 illustrates a diagram of a conventional light-emitting apparatus. As shown in FIG. 6, a light-emitting apparatus 1200 includes a sub-mount 1202 having an electrical circuit 1204; a solder 1206 formed on the sub-mount 1202 to adhere the LED 1210 to the sub-mount 1202, and electrically connecting a substrate 1212 of the LED 1210 and the electrical circuit 1204 of the sub-mount 1202; and an electrical connecting structure 1208 electrical connecting an electrode 1214 of the LED 1210 and the electrical circuit 1204 of the sub-mount 1202, wherein the sub-mount 1202 can be a lead frame or a large scaled mounting substrate suitable for the design of the electrical circuit of the light-emitting apparatus and improving heat dissipation.

SUMMARY OF THE APPLICATION

A semiconductor light-emitting device includes a semiconductor stack including a first semiconductor layer, a second semiconductor layer, and an active layer formed between the first semiconductor layer and the second semiconductor layer, wherein the semiconductor stack includes a first surface; a plurality of depressions penetrating from the first surface, through the first semiconductor layer and the active layer to expose the second semiconductor layer; a first contact structure formed on the first surface to ohmically contact the first surface; a second contact structure formed in the plurality of depressions to ohmically contact the second semiconductor layer; a first pad portion formed on the first surface to electrically connect the first semiconductor layer by the first contact structure; and a second pad portion formed on the first surface to electrically connect the second semiconductor layer by the second contact structure, wherein the first contact structure includes a plurality of extension electrodes, a part of the second contact structure is formed between the plurality of extension electrodes.

A semiconductor light-emitting device includes a semiconductor stack including a side, a first surface, and a second surface opposite to the first surface, wherein the semiconductor stack includes a conductive via extending from the first surface to the second surface; a transparent conductive layer formed on the second surface; a first pad portion and a second pad portion formed on the first surface to electrically connect to the semiconductor stack; and an insulating layer formed between the first pad portion and the semiconductor stack, and between the second pad portion and the semiconductor stack.

A semiconductor light-emitting device includes a semiconductor stack including a first semiconductor layer, a second semiconductor layer, and an active layer between the first semiconductor layer and the second semiconductor layer, wherein the first semiconductor layer includes a periphery surface surrounding the active layer; a plurality of vias penetrating the semiconductor stack to expose the first semiconductor layer; a patterned metal layer formed on the plurality of vias and covered the periphery surface of the first semiconductor layer; a first pad portion formed on the semiconductor stack to electrically connected to the first semiconductor layer; and a second pad portion formed on the semiconductor stack to electrically connected to the second semiconductor layer.

A semiconductor light-emitting device having an outer periphery includes a semiconductor stack including a first semiconductor layer, a second semiconductor layer, and an active layer between the first semiconductor layer and the second semiconductor layer, wherein the first semiconductor layer includes a periphery surface along the outer periphery of the semiconductor light-emitting device; a plurality of vias penetrating the semiconductor stack to expose the first semiconductor layer; and a patterned metal layer formed on the plurality of vias and covered the periphery surface of the first semiconductor layer, wherein the patterned metal layer comprises an area larger than that of the active layer.

DETAILED DESCRIPTION OF PREFERRED EMBODIMENTS

Figure 1:
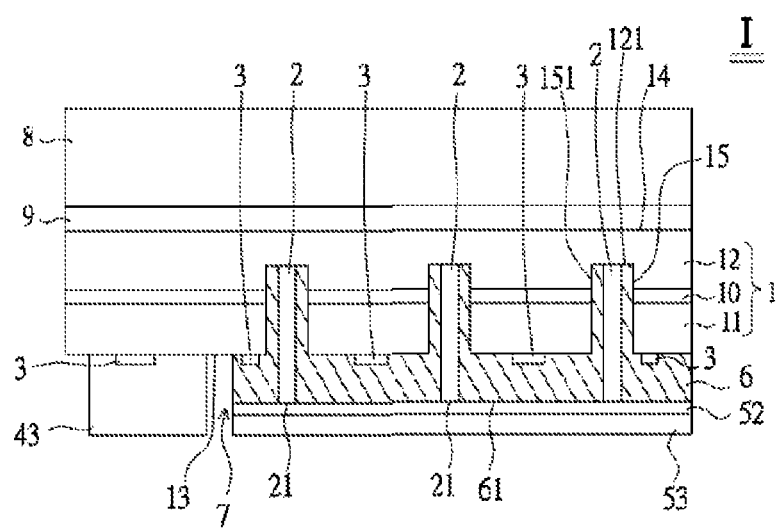
FIG. 1 illustrates a structure diagram of a semiconductor light-emitting device I in accordance with a first embodiment of the present application.

The embodiment of the application is illustrated in detail, and is plotted in the drawings. The same or the similar part is illustrated in the drawings and the specification with the same number.

First Embodiment

FIG. 1 illustrates a structure diagram of a semiconductor light-emitting device I in accordance with a first embodiment of the present application. The semiconductor light-emitting device I is a flip chip type light-emitting diode device including a semiconductor stack having depressions. The semiconductor light-emitting device I includes a semiconductor stack 1 including a first surface 13 and a second surface 14 opposite to the first surface 13. The semiconductor stack 1 includes a first semiconductor layer 11, a second semiconductor layer 12, and an active layer 10 formed between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12 comprise different conductivity types, electricity, polarity, or dopant elements for providing electrons and holes. The active layer 10 is formed between the first semiconductor layer 11 and the second semiconductor layer 12. The active layer 10 converts electrical energy to optical energy. The dominant wavelength of the light is adjusted by changing physical and chemical compositions of one or more layers in the semiconductor stack 1. The material of the semiconductor stack 1 includes aluminum gallium indium phosphide (AlGaInP), aluminum gallium indium nitride (AlGaInN), or zinc oxide (ZnO). The active layer 10 includes single heterostructure (SH), double heterostructure (DH), double-side double heterostructure (DDH), or multi-quantum well (MQW) structure. Specifically, the active layer 10 includes i-type, p-type, or n-type semiconductor. The active layer 10 emits light when an electrical current passes through the semiconductor stack 1. When the active layer 10 includes AlGaInP based material, the active layer 10 emits amber series light, such as red light, orange light, or yellow light; when the active layer 10 includes AlGaInN based material, the active layer 10 emits blue or green light. The present embodiment illustrates the semiconductor stack 1 with aluminum gallium indium phosphide (AlGaInP) based material.

Figure 2:
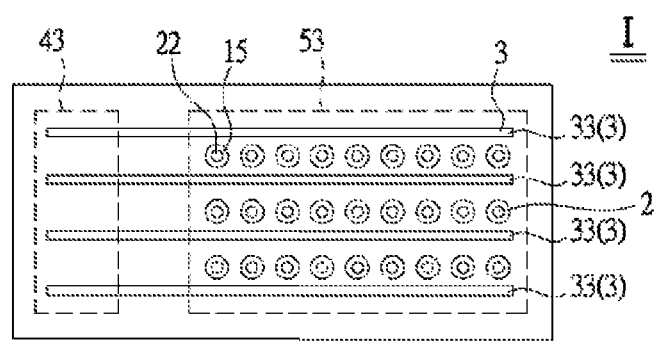
FIG. 2 illustrates a top view of the semiconductor light-emitting device I in accordance with the first embodiment of the present application.

A first contact structure 3 is formed on the first surface 13 to ohmically contact the first semiconductor layer 11, and a first pad portion 43 is formed on a part of the first contact structure 3. When the electrical current is injected into the first pad portion 43, the electrical current is conducted to an area of the first semiconductor layer 11 not covered by the first pad portion 43 through the first contact structure 3 for improving the current spreading. FIG. 2 illustrates a top view of the semiconductor light-emitting device I. The first pad portion 43 is formed on a side of the semiconductor light-emitting device I, and the shape of the first contact structure 3 includes a plurality of finger electrodes extending from an area under the first pad portion 43 to another side opposite to that of the first pad portion 43 for spreading the current to all areas of the semiconductor stack 1. The material of the first pad portion 43 includes titanium (Ti), platinum (Pt), nickel (Ni), tin (Sn), gold (Au), or an alloy thereof; the material of the first contact structure 3 comprises gold (Au), germanium (Ge), beryllium (Be), or an alloy thereof.

A plurality of depressions 15 is formed in the semiconductor stack 1, and each depression 15 penetrates from the first surface 13 of the first semiconductor layer 11, through the first semiconductor layer 11 and the active layer 10, and into the second semiconductor layer 12 to expose a plurality of surfaces 121 on the second semiconductor layer 12. A plurality of second contact structures 2 is formed in the plurality of depressions 15 to ohmically contact the plurality of surfaces 121. A smallest distance between the second contact structure 2 and the first contact structure 3 ranges between 10 μm and 100 μm. A length of the second contact structure 2 is longer than a depth of the depression 15, thus the second contact structure 2 protrudes the first surface 13. An insulating layer 6 is formed between the second contact structure 2 and a sidewall 151 of the depression 15. The insulating layer 6 separates the second contact structure 2 and the sidewall 151 to avoid of the second contact structure 2 directly contacting the active layer 10 and the first semiconductor layer 11. In the embodiment, the plurality of depressions 15 is a plurality of vias. As shown in the top view of the first embodiment in FIG. 2, the plurality of depressions 15 is formed between a plurality of extension electrodes 33 of the first contact structure 3, and is arranged along an extending direction of the extension electrode 33. The second contact structure 2 includes a plurality of conductive rods 22 disposed in the plurality of depressions 15 respectively. A smallest distance between the conductive rod 22 and the extension electrode 33 ranges between 10 μm and 100 μm. The insulating layer 6 not only fills a space between the second contact structure 2 and the sidewall 151, but also covers a part of the first contact structure 3 which is formed on the first surface 13. The insulating layer 6 covers a part of the second contact structure 2 protruding from the first surface 13, and exposes a contact surface 21 of the second contact structure 2. The insulating layer 6 and the contact surface 21 of the second contact structure 2 form a flat surface 61. The material of the second contact structure 2 includes germanium (Ge), beryllium (Be), gold (Au), or an alloy thereof to ohmically contact the second semiconductor layer 12. The insulating layer 6 permits the light emitted from the active layer 10 to transmit thereof. In another embodiment, the first surface 13 can be a rough surface which reduces the total internal reflection of the light passing through the insulating layer 6 and the first surface 13. The material of the insulating layer 6 includes organic materials, such as benzocyclobutene (BCB), perfluorocyclobutane (PFCB), epoxy resin, acrylic resin, cyclic olefin polymer (COC), polymethyl methacrylate (PMMA), polyethylene terephthalate (PET), polycarbonate (PC), polyetherimide, fluorocarbon polymers; inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

A reflective layer 52 covers all of the surface 61 and contacts all of the contact surfaces 21 of the second contact structure 2. The material of the reflective layer 52 includes metal material with high reflectivity, such as silver (Ag), gold (Au), aluminum (Al), titanium (Ti), chromium (Cr), copper (Cu), nickel (Ni), platinum (Pt), or an alloy thereof.

A second pad portion 53 covers the reflective layer 52 to connect the reflective layer 52. The second pad portion 53 conducts the electrical current from the external power source into the semiconductor light-emitting device I, wherein the electrical current sequentially flows through the reflective layer 52, the second contact structure 2 and the semiconductor stack 1, and flows out from the first contact structure 3 and the first pad portion 43. The material of the second pad portion 53 includes titanium (Ti), platinum (Pt), nickel (Ni), tin (Sn), gold (Au), or an alloy thereof. A space 7 is formed between the first pad portion 43 and the second pad portion 53 to separate the first pad portion 43 and the second pad portion 53. A width of the space 7 ranges between 70 μm and 250 μm. When the semiconductor light-emitting device I includes a square shape with a side of 12 mil, the area of the first pad portion 43 and the second pad portion 53 is 15%~80% of the area of the semiconductor light-emitting device I; when the semiconductor light-emitting device I includes a square shape with a side of 28 mil, the area of the first pad portion 43 and the second pad portion 53 is 60%~92% of the area of the semiconductor light-emitting device I; when the semiconductor light-emitting device I includes a square shape with a side of 40 mil, the area of the first pad portion 43 and the second pad portion 53 is 75%~95% of the area of the semiconductor light-emitting device I.

An adhesive layer 9 covers the second surface 14, and the substrate 8 is bonded to the second surface 14 by the adhesive layer 9. The light emitted from the active layer 10 can transmit through the adhesive layer 9 and the substrate 8. In another embodiment, the second surface 14 is a rough surface which reduces the total internal reflection of the light transmitting through the adhesive layer 9 and the second surface 14. The refractive index of the adhesive layer 9 preferably ranges between the refractive index of the second semiconductor layer 12 and the refractive index of the substrate 8, and the refractive index of the substrate 8 is preferably smaller than the refractive index of the adhesive layer 9. In the embodiment, the refractive index of the adhesive layer 9 ranges between 1.77 and 3.3, and the refractive index of the substrate 8 ranges between 1 and 1.77. The material of the adhesive layer 9 includes material which is transparent with respect to the light emitted from the active layer 10, including organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer; inorganic materials, such as silicone, glass; dielectric material, such as aluminum oxide ($Al_2O_3$), silicon nitride (SiNx), silicon oxide ($SiO_2$), titanium oxide ($TiO_2$), or magnesium fluoride ($MgF_2$). A material of the substrate 8 includes transparent material which is transparent with respect to the light emitted from the active layer 10, such as gallium arsenide (GaAs), gallium phosphide (GaP), gallium nitride (GaN), sapphire, diamond, glass, quartz, acrylic, zinc oxide (ZnO), or aluminum nitride (AlN).

Second Embodiment

Figure 3:
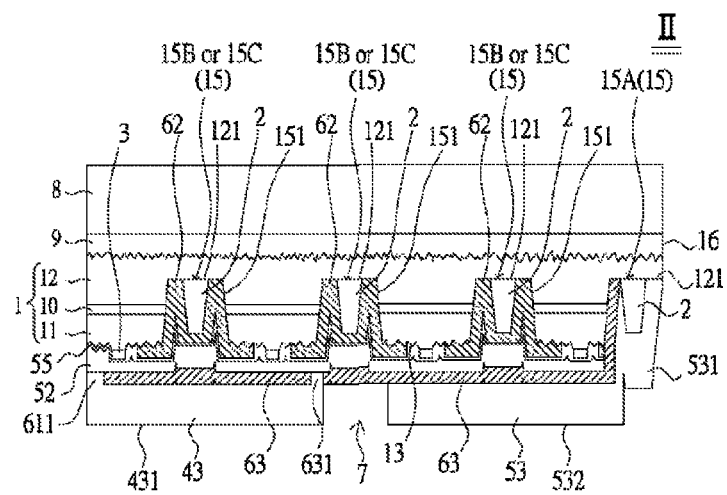
FIG. 3 illustrates a diagram of a semiconductor light-emitting device II in accordance with a second embodiment of the present application.

FIG. 3 illustrates a diagram of a semiconductor light-emitting device II in accordance with a second embodiment of the present application. The semiconductor light-emitting device II is a flip chip type light-emitting diode device including a semiconductor stack 1 having depressions. The semiconductor light-emitting device II includes the semiconductor stack 1 having a first surface 13 and a second surface 14 opposite to the first surface 13. The semiconductor stack 1 includes a first semiconductor layer 11, a second semiconductor layer 12, and an active layer 10 formed between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12 includes different conductivity types, electricity, polarity, or dopant elements for providing electrons and holes. The active layer 10 is formed between the first semiconductor layer 11 and the second semiconductor layer 12. The active layer 10 converts electrical energy to optical energy. The dominant wavelength of the light is adjusted by changing physical and chemical compositions of one or more layers in the semiconductor stack 1. The material of the semiconductor stack 1 includes aluminum gallium indium phosphide (AlGaInP), aluminum gallium indium nitride (AlGaInN), or zinc oxide (ZnO). The active layer 10 includes single heterostructure (SH), double heterostructure (DH), double-side double heterostructure (DDH), or multi-quantum well (MQW) structure. Specifically, the active layer 10 includes i-type, p-type, or n-type semiconductor. The active layer 10 emits light when an electrical current passes through the semiconductor stack 1. When the active layer 10 includes AlGaInP based material, the active layer 10 emits amber series light, such as red light, orange light, or yellow light; when the active layer 10 includes AlGaInN based material, the active layer 10 emits blue or green light. The present embodiment illustrates the semiconductor stack 1 with aluminum gallium indium phosphide (AlGaInP) based material.

In the embodiment, the depression 15 is formed in the semiconductor stack 1, penetrates from the first surface 13 of the first semiconductor layer 11, through the first semiconductor layer 11, the active layer 10, and into the second semiconductor layer 12 to expose a plurality of surfaces 121 on the second semiconductor layer 12. As shown in the top view of the semiconductor light-emitting device II of FIG. 4 in accordance with the second embodiment of the present application, the depression 15 includes a path 15A formed on a side 16 of the semiconductor stack 1, a longitudinal path 15B, or a transversal path 15C, wherein the path 15A, the path 15B, and the path 15C are connected to each other. The second contact structure 2 is formed in the depression 15, continuously along the path 15A, the path 15B, and the path 15C to ohmically contact the surface 121 for uniformly spreading the electrical current on the second semiconductor layer 12. An insulating layer 62 conformably covers the second contact structure 2, the path 15B, the path 15C, and the first surface 13 adjacent to the path 15B and the path 15C, but not covers the first contact structure 3. The insulating layer 62 separates the second contact structure 2 and the sidewall 151 to avoid of the second contact structure 2 directly contacting the active layer 10 and the first semiconductor layer 11. The material of the second contact structure 2 includes germanium (Ge), beryllium (Be), gold (Au), or an alloy thereof to ohmically contact the second semiconductor layer 12. The insulating layer 62 permits the light emitted from the active layer 10 to transmit thereof. The material of the insulating layer 62 includes organic materials, such as benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer; inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

Figure 4:
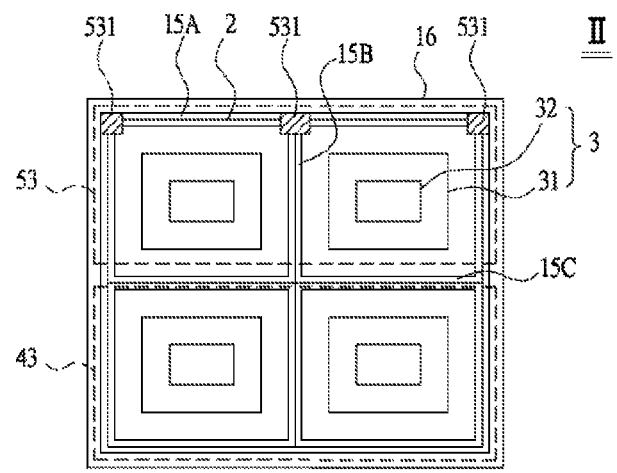
FIG. 4 illustrates a top view of the semiconductor light-emitting device II in accordance with the second embodiment of the present application.

In the embodiment, the first surface 13 can be a rough surface which reduces the total internal reflection of the light passing through the first surface 13 and the insulating layer 62. The method of forming the rough surface includes wet etch, such as soaking in acidic or alkaline etching solution, or dry etching, such as ICP. The contact structure 3 is formed on the first surface 13 to ohmically contact the first semiconductor layer 11. As shown in FIG. 4, the shape of the first contact structure 3 includes a pattern, such as point, line, circle, ellipse, square, or rectangular. In the embodiment, the first contact structure 3 is distributed on the first semiconductor layer 11 in a shape of a plurality of squares including a big square 31 and a small square 32, which are independent to each other and not directly contact with each other. The periphery of each square is surrounded by the second contact structure 2. The material of the first contact structure 3 includes gold (Au), germanium (Ge), beryllium (Be), or an alloy thereof to ohmically contact the first semiconductor layer 11.

A transparent conductive layer 55 conformably covers the first surface 13, the first contact structure 3, and the insulating layer 62. A reflective layer 52 conformably covers the transparent conductive layer 55. The transparent conductive layer 55 includes transparent conductive material and a thickness ranging between 1 µm and 10 µm for adhering with the reflective layer 52 and avoid of the reflective layer 52 from peeling. The material of the reflective layer 52 includes metal material with high reflectivity, such as silver (Ag), gold (Au), aluminum (Al), titanium (Ti), chromium (Cr), copper (Cu), nickel (Ni), platinum (Pt), or an alloy thereof, to reflect the light emitted from the active layer 10 toward the second surface 14.

A patterned insulating layer 63 conformably covers the reflective layer 52, forms along the periphery of the reflective layer 52 to cover the sidewall 151 of the path 15A. The insulating layer 63 includes a via 631 exposing the reflective layer 52. The insulating layer 63 includes non-conductive material organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer; inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

A first pad portion 43 and a second pad portion 53 are formed on the insulating layer 63. A bonding surface 431 of the first pad portion 43 and a bonding surface 532 of the second pad portion 53 are on the same planar surface by forming the insulating layer 63 under the first pad portion 43 and the second pad portion 53. A space 7 is formed between the first pad portion 43 and the second pad portion 53 to separate the first pad portion 43 and the second pad portion 53. In the embodiment, a width of the space 7 ranges between 70 µm and 250 µm. When the semiconductor light-emitting device includes a square shape with a side of 12 mil, the area of the first pad portion 43 and the second pad portion 53 is 15%~80% of the area of the semiconductor light-emitting device; when the semiconductor light-emitting device includes a square shape with a side of 28 mil, the area of the first pad portion 43 and the second pad portion 53 is 60%~92% of the area of the semiconductor light-emitting device; when the semiconductor light-emitting device includes a square shape with a side of 40 mil, the area of the first pad portion 43 and the second pad portion 53 is 75%~95% of the area of the semiconductor light-emitting device. The first pad portion 43 directly contacts the reflective layer 52 through the via 631, the second pad portion 53 is separated from the reflective layer 52 by the insulating layer 63. The second pad portion 53 includes a connecting part 531 covering the path 15A to directly connect the second contact structure 2. The connecting part 531 covers the insulating layer 63 of the sidewall 151 of the path 15A to avoid of directly contacting the active layer 10 and the first semiconductor layer 11. The first pad portion 43 and the second pad portion 53 conduct the electrical current from the external power source into the semiconductor light-emitting device II for emitting light. The electrical current flows into the first pad portion 43, through the hole 631, the reflective layer 52, into the semiconductor stack 1 by way of the areas having lower contact resistance which is between the first contact structure 3 and the first semiconductor layer 11, the electrical current sequentially flows through the first semiconductor layer 11, the active layer 10, and the second semiconductor layer 12, and flows out the second pad portion 53 by the second contact structure 2. The material of the first pad portion 43 and the second pad portion 53 comprise titanium (Ti), platinum (Pt), nickel (Ni), tin (Sn), gold (Au), or an alloy thereof. In another embodiment, the insulating layer 63 is disposed only between the second pad portion 53 and the reflective layer 52, and the first pad portion 43 directly contacts the reflective layer 52 for increasing the heat dissipation efficiency. The first pad portion 43 can be further processed through evaporation for forming the bonding surface 431 of the first pad portion 43 and the bonding surface 532 of the second pad portion 53 on the same planar surface.

An adhesive layer 9 covers the second surface 14, and the substrate 8 is bonded to the second surface 14 by the adhesive layer 9. The light emitted from the active layer 10 can transmit through the adhesive layer 9 and the substrate 8. The second surface 14 can form a rough surface which reduces the total internal reflection and increases the light extraction efficiency when the light transmits through the adhesive layer 9 and the second surface 14. The method of forming the rough surface includes wet etch, such as soaking in acidic or alkaline etching solution, or dry etching, such as ICP. The refractive index of the adhesive layer 9 preferably ranges between the refractive index of the second semiconductor layer 12 and the refractive index of the substrate 8, and the refractive index of the substrate 8 is preferably smaller than the refractive index of the adhesive layer 9. In the present embodiment, the refractive index of the adhesive layer 9 ranges between 1.77 and 3.3, and the refractive index of the substrate ranges between 1 and 1.77. The material of the adhesive layer 9 includes material which is transparent with respect to the light emitted from the active layer 10, including organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer; inorganic materials, such as silicone, glass; dielectric materials, such as aluminum oxide ($Al_2O_3$), silicon nitride (SiNx), silicon oxide ($SiO_2$), titanium oxide ($TiO_2$), or magnesium fluoride ($MgF_2$). A material of the substrate 8 includes transparent material which is transparent with respect to the light emitted from the active layer 10, such as gallium arsenide (GaAs), gallium phosphide (GaP), gallium nitride (GaN), sapphire, diamond, glass, quartz, acryl, zinc oxide (ZnO), or aluminum nitride (AlN).

Figure 8:
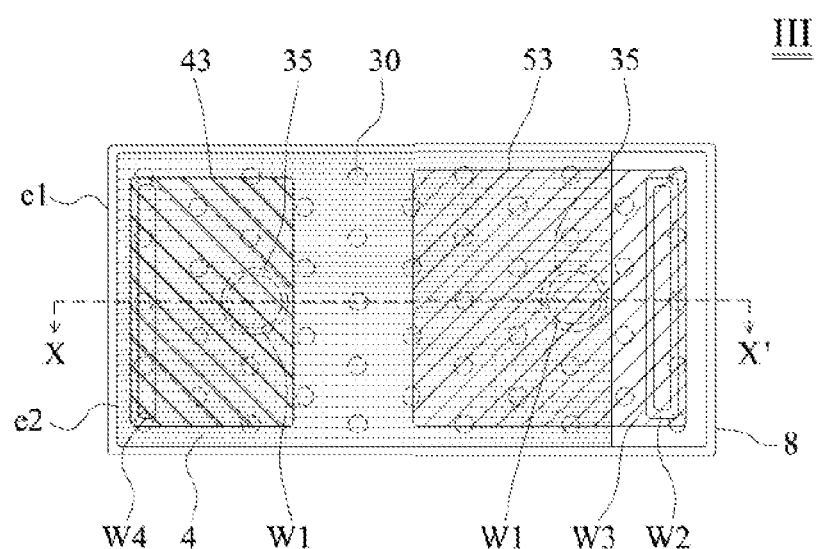
FIG. 8 illustrates a top view of a semiconductor light-emitting device III in accordance with another embodiment of the present application.
Figure 9:
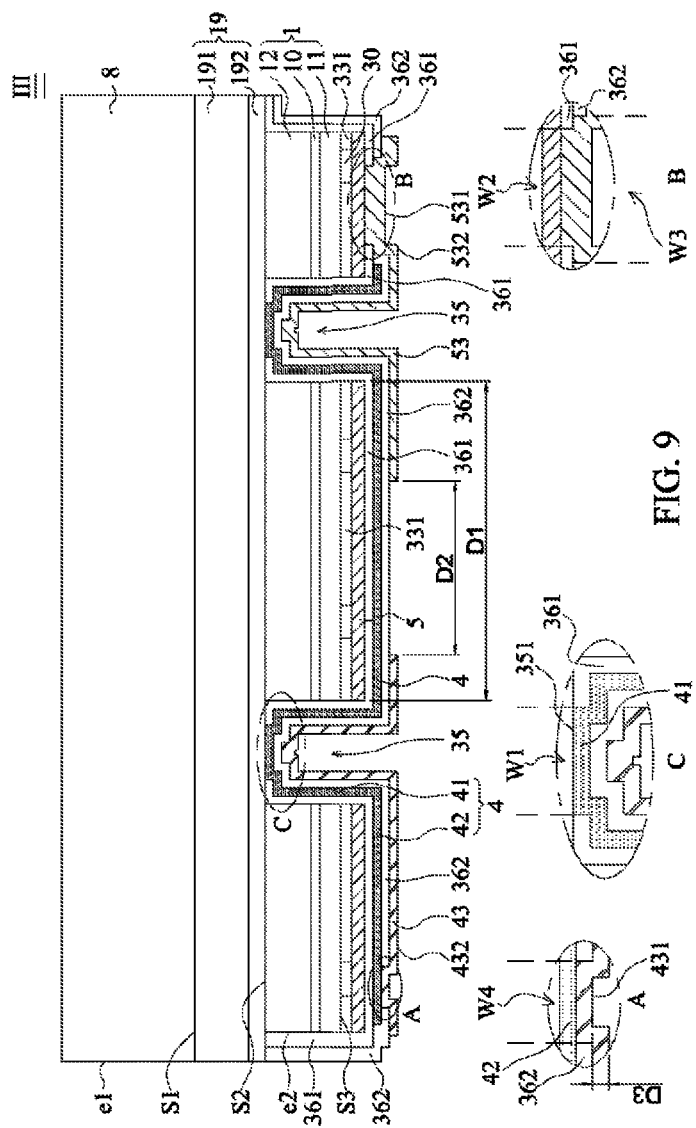
FIG. 9 illustrates a cross-sectional view along line X-X' of FIG. 8.

FIG. 8 illustrates a top view of a semiconductor light-emitting device III in accordance with another embodiment of the present application. FIG. 9 illustrates a cross-sectional view along line X-X' of FIG. 8. The semiconductor light-emitting device III is a flip chip type light-emitting diode device. As shown in FIG. 9, the semiconductor light-emitting device III includes a semiconductor stack 1 including a first surface S3 and a second surface S2 opposite to the first surface S3. The semiconductor stack 1 includes a first semiconductor layer 11, a second semiconductor layer 12, and an active layer 10 formed between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12, such as cladding layers or confinement layers, comprise different conductivity types, electricity, polarity, or dopant elements to provide electrons and holes. The active layer 10 is formed between the first semiconductor layer 11 and the second semiconductor layer 12 so the electrons and the holes combine in the active layer 10 under an electrical current to convert electrical energy to optical energy for emitting a light. The dominant wavelength of the light is adjusted by changing physical and chemical compositions of one or more layers in the semiconductor stack 1. The material of the semiconductor stack 1 includes group III-V semiconductor materials, such as $Al_xIn_yGa_{(1-x-y)}N$ or $Al_xIn_yGa_{(1-x-y)}P$, wherein $0 \leq x, y \leq 1$; $(x+y) \leq 1$. In accordance with the material of the active layer 10, the semiconductor stack 1 can emit a red light with a dominant wavelength between 610 nm and 650 nm, a green light with a dominant wavelength between 530 nm and 570 nm, or a blue light with a dominant wavelength between 450 nm and 490 nm. The active layer 10 includes single heterostructure (SH), double heterostructure (DH), double-side double heterostructure (DDH), or multi-quantum well (MQW) structure. The material of the active layer 10 includes i-type, p-type, or n-type semiconductor.

A plurality of contact structures 30 is uniformly distributed on the first surface S3 of the semiconductor stack 1 to ohmically contact the first semiconductor layer 11 for spreading the current on the first semiconductor layer 11. For example, a metal layer can be deposited on the first surface S3 of the semiconductor stack 1 and patterned to form a plurality of contact structures 30. The material of the contact structure 30 includes gold (Au), germanium (Ge), beryllium (Be), or an alloy thereof. The shape of the contact structure 30 includes circle or polygon. As shown in the top view of the semiconductor light-emitting device III of FIG. 8, the shape of the contact structure 30 is circle and a plurality of contact structures 30 is arranged into a plurality of rows on the semiconductor stack 1, wherein the plurality of contact structures 30 on adjacent two rows are staggered.

A first reflective layer 331 including low refractive index materials is formed on the first surface S3 of the semiconductor stack 1, and/or between the plurality of contact structures 30. Furthermore, the plurality of contact structures 30 can be formed between the first reflective layer 331 and the semiconductor stack 1. Because the refractive index of the group III-V semiconductor materials is between 2 and 4, a material having a refractive index lower than that of the group III-V semiconductor materials is chosen to totally reflect the light emitted from the active layer 10 between the first surface S3 and the first reflective layer 331 for increasing the light extraction efficiency of the semiconductor light-emitting device III. The low refractive index material includes oxide, fluoride, or metal oxide. The fluoride includes magnesium fluoride ($MgF_2$) or calcium fluoride ($CaF_2$). Metal oxide includes titanium oxide ($TiO_2$), tantalum oxide ($Ta_2O_5$), tellurium dioxide ($TeO_2$), yttrium oxide ($Y_2O_3$), hafnium oxide ($HfO_2$), aluminum oxide ($Al_2O_3$), indium zinc oxide (IZO), or indium tin oxide (ITO).

In order to increase the light extraction efficiency of the semiconductor light-emitting device III, the first surface S3 of the semiconductor stack 1 can be a rough surface, and/or a second reflective layer 5 is formed on the first surface S3. The method for forming the rough surface includes etching, polishing, or printing. The etching method includes wet etch, such as soaking in acidic or alkaline etching solution, or dry etching, such as ICP. The structure of the second reflective layer 5 can be one or more layers. The material of the second reflective layer 5 includes metal material with high reflectivity, such as silver (Ag), gold (Au), aluminum (Al), titanium (Ti), chromium (Cr), copper (Cu), nickel (Ni), platinum (Pt), or an alloy thereof. The high reflectivity is 80% or above with respect to the dominant wavelength of the light emitted from the semiconductor light-emitting device III. The second reflective layer 5 is more away from the semiconductor stack 1 than the first reflective layer 331 so the light not reflected by the first reflective layer 331 can be further reflected by the second reflective layer 5. As shown in FIG. 9, the second reflective layer 5 contacts with the first reflective layer 331 and/or the plurality of contact structures 30 for forming electrical connection when electrical current is injected.

A transparent conductive layer 19 is formed on the second surface S2 of the semiconductor stack 1 and electrically connected to the semiconductor stack 1 when electrical current is injected. The material of the transparent conductive layer 19 includes transparent material which is transparent to the light emitted from the active layer 10. In order to reduce the possibility of total internal reflection of the light emitted from the active layer 10 on the second surface S2, the transparent conductive layer 19 includes non group III-V semiconductor materials, wherein the refractive index of the material of the transparent conductive layer 19 is lower than that of the semiconductor stack 1, and the structure of the transparent conductive layer 19 can be one or more layers, for example, including a first transparent conductive layer 191 and a second transparent conductive layer 192. Specifically, when the transparent conductive layer 19 is a structure of multi layers, the first transparent conductive layer 191, which is more away from the semiconductor stack 1 than other transparent conductive layers, includes material for improving lateral current spreading, for example, indium zinc oxide (IZO). The second transparent conductive layer 192, which is more closer to the semiconductor stack 1 than other transparent conductive layers, includes material for forming ohmically contact with the second semiconductor layer 12, for example, indium tin oxide (ITO).

In order to increase the light extraction efficiency of the semiconductor light-emitting device III, the second surface S2 of the semiconductor stack 1 can be a rough surface to reduce total internal reflection. The method for forming the rough surface includes etching, polishing, or printing. The etching method includes wet etch, such as soaking in acidic or alkaline etching solution, or dry etching, such as ICP.

In other embodiments of the present application, a substrate 8 can be optionally formed on the semiconductor stack 1. The substrate 8 can be bonded to the second surface S2 of the semiconductor stack 1 by the transparent conductive layer 19. The substrate 8 includes transparent material which is transparent to the light emitted from the active layer 10, such as gallium arsenide (GaAs), gallium phosphide (GaP), gallium nitride (GaN), sapphire, diamond, glass, quartz, acrylic, zinc oxide (ZnO), or aluminum nitride (AlN). In order to reduce the total internal reflection of the light emitted from the active layer 10 on the interface S1 between the substrate 8 and the transparent conductive layer 19, the refractive index of the material of the substrate 8 is smaller than that of the transparent conductive layer 19, and the refractive index of the transparent conductive layer 19 is between the refractive index of the substrate 8 and the refractive index of the semiconductor stack 1. Concerning the process yield, a side e1 of the substrate 8 can be planar with a side e2 of the semiconductor stack 1, or the side e1 of the substrate 8 protrudes the side e2 of the semiconductor stack 1, as shown in FIG. 9.

In an embodiment of the present application, the semiconductor stack 1 includes a conductive via 35 extending from the first surface S3 to the second surface S2. As shown in FIG. 8, the semiconductor light-emitting device III includes a plurality of conductive vias 35, wherein the plurality of conductive vias 35 is separated from each other from a top view of the semiconductor light-emitting device III, and each of the plurality of conductive vias 35 is surrounded by the semiconductor stack 1. As shown in FIG. 9, the plurality of conductive vias 35 penetrates from the first surface S3 of the semiconductor stack 1, through the semiconductor stack 1 by removing a part of the semiconductor stack 1. In a variant of the embodiment, an end 351 of the conductive via 35 exposes on the second surface S2 of the semiconductor stack 1 as shown in FIG. 9. In another variant of the embodiment, the end 351 of the conductive via 35 extends a depth into the transparent conductive layer 19 (not shown). The forming position of the conductive via 35 is staggered with the forming position of the contact structure 30, as shown in FIG. 8, the plurality of contact structures 30 surrounds the conductive via 35 and is disposed on the periphery of the conductive via 35.

A first insulating layer 361 can be deposited on the semiconductor stack 1 and in the conductive via 35 through evaporation. A part of the first insulating layer 361 covering the end 351 of the conductive via 35 and a part of the first insulating layer 361 covering the second reflective layer 5 can be removed through patterning to form a first opening W1 on the end 351 of the conductive via 35 and expose the transparent conductive layer 19, and to form a second opening W2 on the second reflective layer 5 and expose the second reflective layer 5. The material of the first insulating layer 361 includes non-conductive material including organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer, inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

As shown in FIG. 8 and FIG. 9, a conductive material, such as metal, is deposited in the conductive via 35 through evaporation or sputtering to cover the first opening W1 and cover a part of the first insulating layer 361 to form a connecting layer 4. The connecting layer 4 includes a first connecting layer 41 formed in the conductive via 35 and a second connecting layer 42 formed on the first insulating layer 361, wherein the first connecting layer 41 surrounds the periphery of the conductive via 35, the first insulating layer 361 is formed between the semiconductor stack 1 and the first connecting layer 41 to electrically insulate the semiconductor stack 1 and the first connecting layer 41, and a plurality of connecting layers 41 formed in the plurality of conductive vias 35 is electrically connected to each other through the second connecting layer 42. As shown in FIG. 9, the end 351 of the plurality of conductive vias 35 is exposed on the second surface S2 of the semiconductor stack 1, the first opening W1 and the second opening W2 are formed on the second surface S2 and the first surface S3 respectively by patterning the first insulating layer 361, and the connecting layer 4 covers the first opening W1 and exposes the second opening W2. When the transparent conductive layer 19 includes a structure of multi layers, for example, includes the first transparent conductive layer 191 and the second transparent conductive layer 192, the end 351 of the conductive via 35 can extend into the first transparent conductive layer 191 which is more away from the semiconductor stack 1 than other transparent conductive layers. In view of the better lateral current spreading ability of the first transparent conductive layer 191, the current injected from the connecting layer 4 is uniformly spreads in the first transparent conductive layer 191 and conducted to the second semiconductor layer 12 through the second transparent conductive layer 192.

A second insulating layer 362 can be deposited on the semiconductor stack 1 by evaporation or sputtering. A part of the second insulating layer 362 covering the second connecting layer 42 and a part of the second insulating layer 362 covering the second reflective layer 5 can be removed through patterning to form a third opening W3 on the second reflective layer 5 and expose the second reflective layer 5, and to form a fourth opening W4 on the second connecting layer 42 and expose the second connecting layer 42. From the top view of the semiconductor light-emitting device III, the third opening W3 is larger than the second opening W2, the position of the third opening W3 and the position of the second opening W2 are overlapped, and the position of the fourth opening W4 and the position of the first opening W1 can be overlapped or staggered, as shown in FIG. 8. The material of the second insulating layer 362 includes non-conductive material including organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer; inorganic materials, such as silicone, glass; dielectric materials, such as aluminum oxide ($Al_2O_3$), silicon nitride (SiN$_x$), silicon oxide (SiO$_2$), titanium oxide (TiO$_2$), or magnesium fluoride (MgF$_2$).

A first pad portion 43 and a second pad portion 53 are formed on the same side of the semiconductor stack 1. The first pad portion 43 is formed on partial surface of the second insulating layer 362 to cover the fourth opening W4 for electrically connecting to the connecting layer 4. In an embodiment of the present application, a metal material is deposited in the fourth opening W4 and the conductive via 35, the metal material is continuously deposited along the conductive via 35, the sidewall of the first insulating layer 361, and/or the second insulating layer 362 to cover partial surface of the second insulating layer 362 to form the first pad portion 43. As shown in the cross-sectional view of the semiconductor light-emitting device III, the first pad portion 43 includes a first face 431 and a second face 432 protruding the first face 431, wherein the first face 431 and the second face 432 are approximately parallel with the first surface S3 of the semiconductor stack 1. A height D3 is formed between the first face 431 and the second face 432, and the height D3 is larger than or equal to a thickness of the second insulating layer 362.

As shown in FIG. 9, a part of the surface of the second reflective layer 5 is not covered by the first insulating layer 361 and/or the second insulating layer 362. The metal material can be evaporated in the conductive via 35, the second opening W2 and/or the third opening W3, and the metal material is continuously deposited along the conductive via 35, the sidewall of the first insulating layer 361 and/or the sidewall of the second insulating layer 362 to extend onto a part of the second insulating layer 362 for forming the second pad portion 53. As shown in the cross-sectional view of the semiconductor light-emitting device III of FIG. 9, the second pad portion 53 includes a first face 531 and a second face 532 protruding the first face 531, wherein the first face 531 and the second face 532 are approximately parallel with the first surface S3 of the semiconductor stack 1. From a top view of the semiconductor light-emitting device III, the conductive via 35 is formed on an area covered by the first pad portion 43 and/or the second pad portion 53. In a embodiment of the present application, concerning the current spreading ability of the transparent conductive layer 19, one of the plurality of conductive vias 35 is formed in a region covered by the first pad portion 43 and another one of the plurality of conductive vias 35 is formed in a region covered by the second pad portion 53. The shortest distance D1 between the two conductive vias 35 is larger than the shortest distance D2 between the first pad portion 43 and the second pad portion 53 as shown in FIG. 9.

From the top view of the semiconductor light-emitting device III, the connecting layer 4 extends from the side e2 of the semiconductor stack 1 to the side of the conductive via 35 to overlap with the forming regions of the first pad portion 43 and the second pad portion 53, and cover the plurality of conductive vias 35 so as to connect the plurality of conductive vias 35 as shown in FIG. 8, or locally forms between the plurality of conductive vias 35 to connect the plurality of conductive vias 35 with a patterned structure (not shown), for example, line or mesh.

An electrical current from external power source can be injected from the first pad portion 43 and conducted to the second semiconductor layer 12 through the connecting layer 4 and the transparent conductive layer 19. The material of the first pad portion 43 includes titanium (Ti), platinum (Pt), nickel (Ni), tin (Sn), gold (Au), or an alloy thereof.

The second pad portion 53 is formed on a part of the contact structure 30. When an electrical current from external power source is injected into the second pad portion 53, the second pad portion 53 is electrically connected with the first semiconductor layer 11 through the contact structure 30. The material of the second pad portion 53 includes titanium (Ti), platinum (Pt), nickel (Ni), tin (Sn), gold (Au), or an alloy thereof. An area of the first pad portion 43 can be the same as or different from that of the second pad portion 53.

Figure 10:
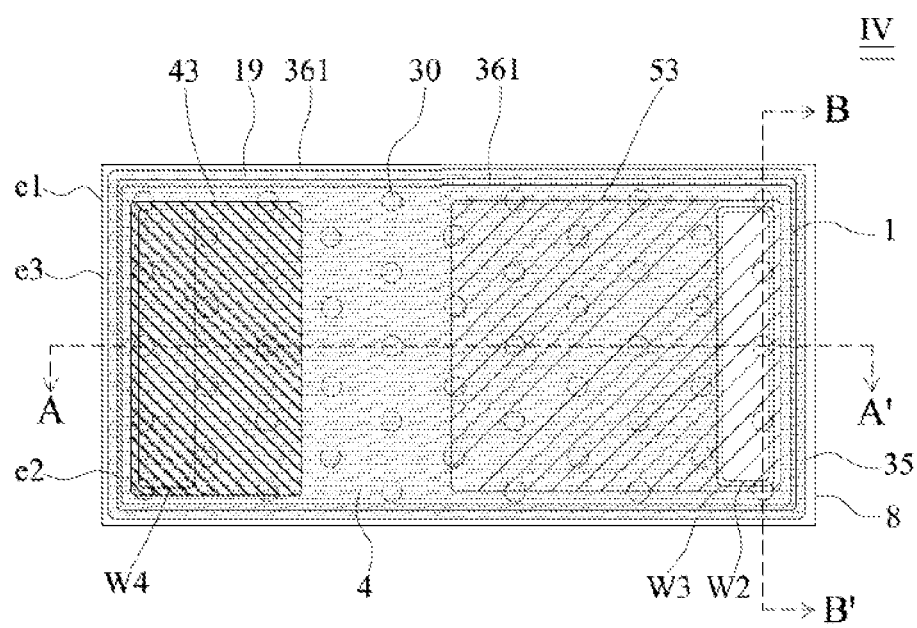
FIG. 10 illustrates a top view of a semiconductor light-emitting device IV in accordance with another embodiment of the present application.
Figure 11:
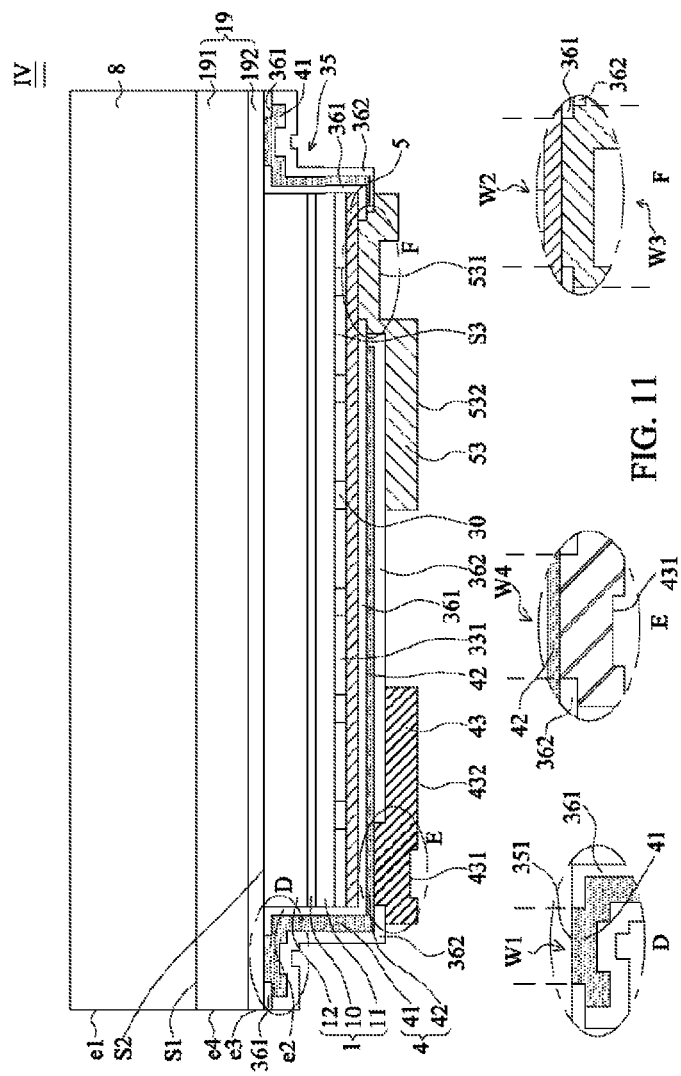
FIG. 11 illustrates a cross-sectional view along line A-A' of FIG. 10.
Figure 12:
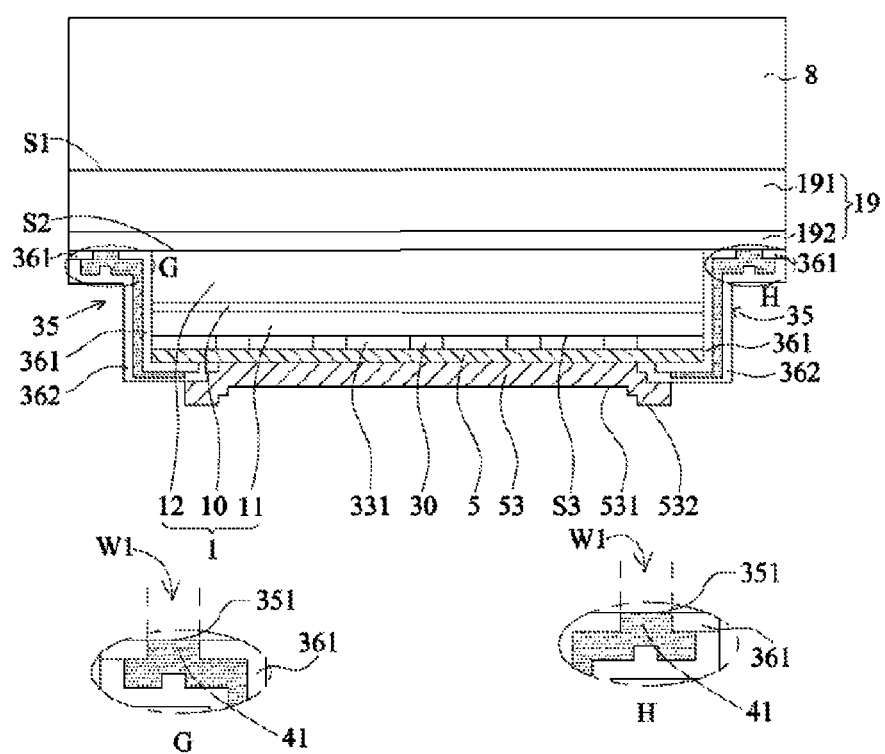
FIG. 12 illustrates a cross-sectional view along line B-B' of FIG. 10.

FIG. 10 illustrates a top view of a semiconductor light-emitting device IV in accordance with another embodiment of the present application. FIG. 11 illustrates a cross-sectional view along line A-A' of FIG. 10. FIG. 12 illustrates a cross-sectional view along line B-B' of FIG. 10. The semiconductor light-emitting device IV is a flip chip type light-emitting diode device. As shown in FIG. 11 and FIG. 12, the semiconductor light-emitting device IV includes a semiconductor stack 1 including a first surface S3, a second surface S2 opposite to the first surface S3, and a side e2 connecting the first surface S3 and the second surface S2. The semiconductor stack 1 includes a first semiconductor layer 11, a second semiconductor layer 12, and an active layer 10 formed between the first semiconductor layer 11 and the second semiconductor layer 12, wherein the first surface S3 is the surface of the first semiconductor layer 11 and the second surface S2 is the surface of the second semiconductor layer 12. The first semiconductor layer 11 and the second semiconductor layer 12 such as cladding layers or confinement layers comprise different conductivity types, electricity, polarity, or dopant elements to provide electrons and holes. The active layer 10 is formed between the first semiconductor layer 11 and the second semiconductor layer 12 so the electrons and the holes combine in the active layer 10 under an electrical current to convert electrical energy to optical energy for emitting a light. The dominant wavelength of the light is adjusted by changing physical and chemical compositions of one or more layers in the semiconductor stack 1. The material of the semiconductor stack 1 includes group III-V semiconductor materials, such as Al$_x$In$_y$Ga$_{(1-x-y)}$N or Al$_x$In$_y$Ga$_{(1-x-y)}$P, wherein 0≤x, y≤1; (x+y)≤1. In accordance with the material of the active layer 10, the semiconductor stack 1 can emit a red light with a dominant wavelength between 610 nm and 650 nm, a green light with a dominant wavelength between 530 nm and 570 nm, or a blue light with a dominant wavelength between 450 nm and 490 nm. The active layer 10 includes single heterostructure (SH), double heterostructure (DH), double-side double heterostructure (DDH), or multi-quantum well (MQW) structure. The material of the active layer 10 includes i-type, p-type, or n-type semiconductor.

A plurality of contact structures 30 is uniformly distributed on the first surface S3 of the semiconductor stack 1 to ohmically contact the first semiconductor layer 11 for spreading the current on the first semiconductor layer 11. For example, a metal layer can be deposited on the first surface S3 of the semiconductor stack 1 and patterned to form a plurality of contact structures 30. The material of the contact structure 30 includes gold (Au), germanium (Ge), beryllium (Be), or an alloy thereof. The shape of the contact structure 30 includes circle or polygon. From the top view of the semiconductor light-emitting device IV of FIG. 10, the shape of the contact structure 30 is circle and a plurality of contact structures 30 is arranged into a plurality of rows on the semiconductor stack. 1, wherein the plurality of contact structures 30 disposed on adjacent two rows is staggered.

A first reflective layer 331 including low refractive index materials is formed on the first surface S3 of the semiconductor stack 1, and/or between the plurality of contact structures 30. Furthermore, the plurality of contact structures 30 can be formed between the first reflective layer 331 and the semiconductor stack 1. Because the refractive index of the group III-V semiconductor materials is between 2 and 4, a material having a refractive index lower than that of the group III-V semiconductor materials is chosen to totally reflect the light emitted from the active layer 10 between the first surface S3 and the first reflective layer 331 for increasing the light extraction efficiency of the semiconductor light-emitting device IV. The low refractive index material includes oxide, fluoride, or metal oxide. The fluoride includes magnesium fluoride ($MgF_2$) or calcium fluoride ($CaF_2$). Metal oxide includes titanium oxide ($TiO_2$), tantalum oxide ($Ta_2O_5$), tellurium dioxide ($TeO_2$), yttrium oxide ($Y_2O_3$), hafnium oxide ($HfO_2$), aluminum oxide ($Al_2O_3$), indium zinc oxide (IZO), or indium tin oxide (ITO).

In order to increase the light extraction efficiency of the semiconductor light-emitting device IV, the first surface S3 of the semiconductor stack 1 can be a rough surface and/or a second reflective layer 5 is formed on the first surface S3. The method for forming the rough surface includes etching, polishing, or printing. The etching method includes wet etch, such as soaking in acidic or alkaline etching solution, or dry etching, such as ICP. The structure of the second reflective layer 5 can be one or more layers. The material of the second reflective layer 5 includes metal material with high reflectivity, such as silver (Ag), gold (Au), aluminum (Al), titanium (Ti), chromium (Cr), copper (Cu), nickel (Ni), platinum (Pt), or an alloy thereof. The high reflectivity is 80% or above with respect to the dominant wavelength of the light emitted from the semiconductor light-emitting device III. The second reflective layer 5 is more away from the semiconductor stack 1 than the first reflective layer 331 so the light not reflected by the first reflective layer 331 can be further reflected by the second reflective layer 5. As shown in FIG. 11 and FIG. 12, the second reflective layer 5 contacts with the first reflective layer 331 and/or the plurality of contact structures 30 for forming electrical connection when electrical current is injected, A transparent conductive layer 19 is formed on the second surface S2 of the semiconductor stack 1. The transparent conductive layer 19 includes a first side e3 and a second side e4. In a variant of the embodiment, the first side e3 and the second side e4 are approximately planar; in another variant of the embodiment, the second side e4 protrudes the first side e3. The first side e3 of the transparent conductive layer 19 and the side e2 of the semiconductor stack 1 are approximately planar. The transparent conductive layer 19 is electrically connected to the semiconductor stack 1 when the electrical current is injected. The material of the transparent conductive layer 19 includes transparent material which is transparent to the light emitted from the active layer 10. In order to reduce the total internal reflection of a light emitted from the active layer 10 on the second surface S2, the transparent conductive layer 19 does not includes group III-V semiconductor material. The refractive index of the material of the transparent conductive layer 19 is lower than that of the semiconductor stack 1, and the structure of the transparent layer 19 can be one or more layers, for example, includes a first transparent conductive layer 191 and a second transparent conductive layer 192. Specifically, when the transparent conductive layer is a structure of multi layers, the first transparent conductive layer 191, which is more away from the semiconductor stack 1 than other transparent conductive layers, includes material for improving lateral current spreading, for example, indium zinc oxide (IZO). The second transparent conductive layer 192, which is closer to the semiconductor stack 1 than other transparent conductive layers, includes material for forming ohmically contact with the second semiconductor layer 12, for example, indium tin oxide (ITO).

In order to increase the light extraction efficiency of the semiconductor light-emitting device IV, the second surface S2 of the semiconductor stack 1 can be a rough surface to reduce total internal reflection. The method for forming the rough surface includes etching, polishing, or printing. The etching method includes wet etch, such as soaking acidic or alkaline etching solution, or dry etching, such as ICP.

In other embodiments of the present application, a substrate 8 can be optionally formed on the semiconductor stack 1. The substrate 8 can be bonded to the second surface S2 of the semiconductor stack 1 through the transparent conductive layer 19. The substrate 8 includes transparent material which is transparent to the light emitted from the active layer 10, such as gallium arsenide (GaAs), gallium phosphide (GaP), gallium nitride (GaN), sapphire, diamond, glass, quartz, acrylic, zinc oxide (ZnO), or aluminum nitride (AlN). In order to reduce the total internal reflection of the light emitted from the active layer 10 on the interface S1 between the substrate 8 and the transparent conductive layer 19, the refractive index of the material of the substrate 8 is smaller than that of the transparent conductive layer 19, and the refractive index of the transparent conductive layer 19 is between the refractive index of the substrate 8 and the refractive index of the semiconductor stack 1. Concerning the process yield, a side e1 of the substrate 8 and the second side e4 of the transparent conductive layer 19 are approximately planar, and the side e1 of the substrate 8 protrudes the side e2 of the semiconductor stack 1, as shown in FIG. 11.

In an embodiment of the present application, the conductive via 35 extends from the first surface S3 to the second surface S2. As shown in FIG. 10, the conductive vias 35 surrounds the periphery of the semiconductor stack 1 from the top view of the semiconductor light-emitting device IV. As shown in FIG. 11, the conductive via 35 is formed on the side e2 of the semiconductor stack 1 by removing part of the semiconductor stack 1 such that the conductive via 35 is formed along the side e2 of the semiconductor stack 1 by penetrating from the first surface S3 of the semiconductor stack 1, through the semiconductor stack 1 and exposing an end 351 of the conductive via 35 on a surface of the transparent conductive layer 19. In an variant of the embodiment, the end 351 of the conductive via 35 extends a depth into the transparent conductive layer 19 (not shown) by removing a part of the semiconductor stack 1 and a part of the transparent conductive layer 19. When the transparent conductive layer 19 includes a multi-layer structure, for example, includes a first transparent conductive layer 191 and a second transparent conductive layer 192, the end 351 of the conductive via 35 extends into the first transparent conductive layer 191 which is more away from the semiconductor stack 1 than other transparent conductive layers. The electrical current is uniformly distributed in the first transparent conductive layer 191 through the first transparent conductive layer 191 having better lateral current spreading ability than other transparent conductive layers. Then the electrical current is conducted to the second semiconductor layer 12 through the second transparent conductive layer 192. The forming positions of the conductive vias 35 and the contact structure 30 are staggered as shown in FIG. 10 and FIG. 11. A plurality of contact structures 30 is formed on the first surface S3 of the semiconductor stack 1, and the conductive via 35 is formed on the side e2 of the semiconductor stack 1 to surround the plurality of contact structures 30.

A first insulating layer 361 can be deposited on the semiconductor stack 1 and the conductive via 35 by evaporation. A part of the first insulating layer 361 covering the end 351 of the conductive via 35 and a part of the first insulating layer 361 covering the second reflective layer 5 can be removed through patterning to form a first opening W1 on the end 351 of the conductive via 35 and expose the transparent conductive layer 19, and to form a second opening W2 on the second reflective layer 5 and expose the second reflective layer 5. The material of the first insulating layer 361 includes non-conductive material including organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer; inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

As shown in FIG. 11, a conductive material, such as metal, is deposited in the conductive via 35 through evaporation or sputtering to cover the first opening W1 and part of the first insulating layer 361 to form a connecting layer 4. The connecting layer 4 includes a first connecting layer 41 formed in the conductive via 35 and a second connecting layer 42 formed on a side of the first insulating layer 361 opposite to the second reflective layer 5, wherein the first insulating layer 361 is formed between the semiconductor stack 1 and the first connecting layer 41 to electrically insulate the semiconductor stack 1 and the first connecting layer 41. From a top view of the semiconductor light-emitting device IV (not shown), the connecting layer 4 can be a patterned structure, for example, line or mesh, formed on the first surface S3 to electrically connect to the conductive via 35. As shown in FIG. 11, the connecting layer 4 can be connected to a side of the conductive via 35, or connected to a plurality of sides of the conductive via 35. As shown in FIG. 11 and FIG. 12, the connecting layer 4 surrounds the sidewall of the semiconductor stack 1 and connects the transparent conductive layer 192 through the first opening W1.

A second insulating layer 362 can be deposited on the semiconductor stack 1 and the conductive via 35 by evaporation. A part of the second insulating layer 362 covering the second connecting layer 42 and a part of the second insulating layer 362 covering the second reflective layer 5 can be removed through patterning to form a third opening W3 on the second reflective layer 5 and expose the second reflective layer 5, and to form a fourth opening W4 on the second connecting layer 42 and expose the second connecting layer 42. From the top view of the semiconductor light-emitting device IV, the third opening W3 is larger than the second opening W2, the position of the third opening W3 and the position of the second opening W2 are overlapped, and the position of the fourth opening W4 and the position of the first opening W1 can be overlapped or staggered, as shown in FIG. 8. The material of the second insulating layer 362 includes non-conductive material including organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, fluorocarbon polymer; inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

A first pad portion 43 and a second pad portion 53 are formed on the same side of the semiconductor stack 1. The first pad portion 43 forms on a part surface of the second insulating layer 362 and covers the fourth opening W4 to electrically connect the connecting layer 4. In an embodiment of the present application, a metal material is deposited on the fourth opening W4 and continuously deposited to cover a part surface of the second insulating layer 362 to form the first pad portion 43. As shown in the cross-sectional view of the semiconductor light-emitting device IV, the first pad portion 43 includes a first face 431 and a second face 432 protruding the first face 431, wherein the first face 431 and the second face 432 are approximately parallel with the first surface S3 of the semiconductor stack 1, a height is formed between the first face 431 and the second face 432, and the height is larger than or equal to a thickness of the second insulating layer 362.

As shown in FIG. 11, a part of the surface of the second reflective layer 5 is not covered by the first insulating layer 361 and/or the second insulating layer 362, a metal material can be evaporated in the second opening W2 and/or the third opening W3, and continuously deposited along the sidewall of the first insulating layer 361 and/or the sidewall of the second insulating layer 362 to extend onto a part of the second insulating layer 362 to form the second pad portion 53. As shown in the cross-sectional view of the semiconductor light-emitting device IV of FIG. 11, the second pad portion 53 includes a first face 531 and a second face 532 protruding the first face 531, wherein the first face 531 and the second face 532 are approximately parallel with the first surface S3 of the semiconductor stack 1. From a top view of the semiconductor light-emitting device IV, the connecting layer 4 is formed beyond the region of the second opening W2 and/or the third opening W3. The conductive via 35 surrounds the first pad portion 43 and/or the second pad portion 53, and the connecting layer 4 is formed in the region of the first pad portion 43 and/or the second pad portion 53.

An electrical current from external power source can be injected from the first pad portion 43, and the electrical current is conducted to the second semiconductor layer 12 through the connecting layer 4 and the transparent conductive layer 19. The material of the first pad portion 43 includes titanium (Ti), platinum (Pt), nickel (Ni), tin (Sn), gold (Au), or an alloy thereof.

The second pad portion 53 is formed on a part of the contact structure 30. When an electrical current from external power source is injected into the second pad portion 53, the second pad portion 53 is electrically connected with the first semiconductor layer 11 through the contact structure 30. The material of the second pad portion 53 includes titanium (Ti), platinum (Pt), nickel (Ni), tin (Sn), gold (Au), or an alloy thereof. An area of the first pad portion 43 can be the same as or different from that of the second pad portion 53.

FIGS. 13-20 illustrate a method of manufacturing a semiconductor light-emitting device V in accordance with an embodiment of the present application, in which FIGS. 13A, 14A, 15A, 16A, 17A, 18A, 19A, and 20A are plan views, and FIGS. 13B, 14B, 15B, 16B, 17B, 18B, 19B, 20B are sectional views respectively taken along line X-X' in FIGS. 13A, 14A, 15A, 16A, 17A, 18A, 19A, and 20A.

Figure 13A:
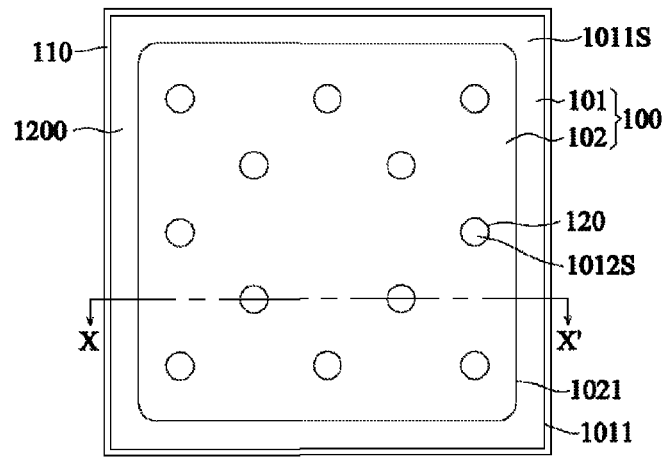
FIGS. 13A, 13B, 14A, 14B, 15A, 15B, 16A, 16B, 17A, 17B, 18A, 18B, 19A, 19B, 20A, and 20B illustrate a method of manufacturing a semiconductor light-emitting device V.
Figure 13B:
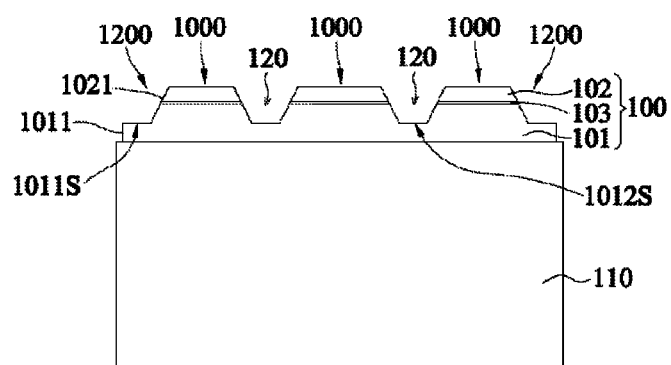

Referring to FIG. 13A and FIG. 13B, a semiconductor stack 100 is formed on a growth substrate 110. The growth substrate 110 can be a sapphire substrate, but is not limited thereto. The semiconductor stack 100 includes a first semiconductor layer 101, a second semiconductor layer 102, and an active layer 103 formed between the first semiconductor layer 101 and the second semiconductor layer 102. Each of the first semiconductor layer 101 and the second semiconductor layer 102 may be composed of a single layer or multiple layers. Further, the active layer 103 may have a single-quantum well structure or multi-quantum well structure. The semiconductor stack 100 may be formed of group III nitride based compound semiconductor on the growth substrate 110 by metal organic chemical vapor deposition (MOCVD) or molecular beam epitaxy (MBE). A buffer layer (not shown) may be formed before forming the compound semiconductor layers. The buffer layer is formed to relieve lattice mismatch between the growth substrate 110 and the semiconductor stack 100 and may be formed of a GaN-based material layer, such as gallium nitride, aluminum gallium nitride or aluminum nitride. The semiconductor stack 100 including an outer periphery 1011 is patterned by removing portions of the first semiconductor layer 101, the second semiconductor layer 102, and the active layer 103 to form a plurality of vias 120 exposing a surface 1012S of the first semiconductor layer 101, a surrounding region 1200 exposing a periphery surface 1011S of the first semiconductor layer 101, and one or a plurality of semiconductor constructions 1000 surrounded by the surrounding region 1200. The semiconductor stack 100 can be patterned by photolithography and etching process. The plurality of semiconductor constructions 1000 is connected to each other through the first semiconductor layer 101. The semiconductor construction 1000 includes an upper part and a lower part, wherein the lower part includes a width larger than a width of the upper part in a sectional view. The plurality of vias 120 includes a circular shape in a plan view, and/or the surrounding region 1200 includes a rectangular shape in a plan view, but is not limited thereto. The one or the plurality of semiconductor constructions 1000 includes an inclined sidewall 1021. The second semiconductor layer 102 and the active layer 103 are exposed to the surrounding region 1200 and the plurality of vias 120. The upper part of the semiconductor construction 1000 and the periphery surface 1011S of the first semiconductor layer 101 is connected by the inclined sidewall 1021.

Figure 14A:
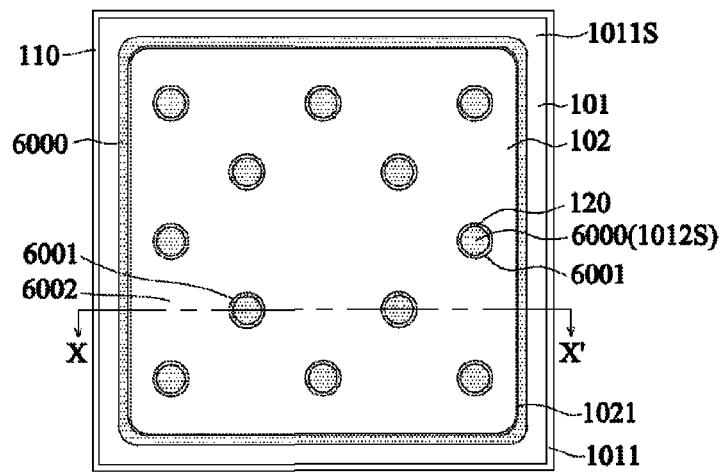
Figure 14B:
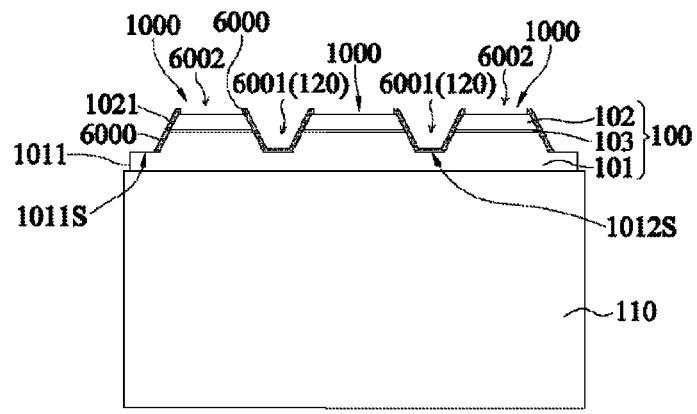

Referring to FIG. 14A and FIG. 14B, a first insulating layer 6000 is formed to cover the surface 1012S of the first semiconductor layer 101 in the plurality of vias 120, and the inclined sidewall 1021 of the semiconductor construction 1000. In other words, the first insulating layer 6000 includes a first group of first insulating regions 6001 corresponding to the plurality of vias 120, and a second group of first insulating openings 6002 respectively formed on the upper part of the one or the plurality of semiconductor constructions 1000 to expose the second semiconductor layer 102. The first insulating layer 6000 includes a single layer or multiple layers, such as a silicon oxide or silicon nitride film. Alternatively, the first insulating layer 6000 includes a distributed Bragg reflector, which is formed by alternately stacking insulation layers having different refraction indices. For example, the first insulating layer 6000 can be formed by alternately stacking $SiO_x/TiO_x$.

Figure 15A:
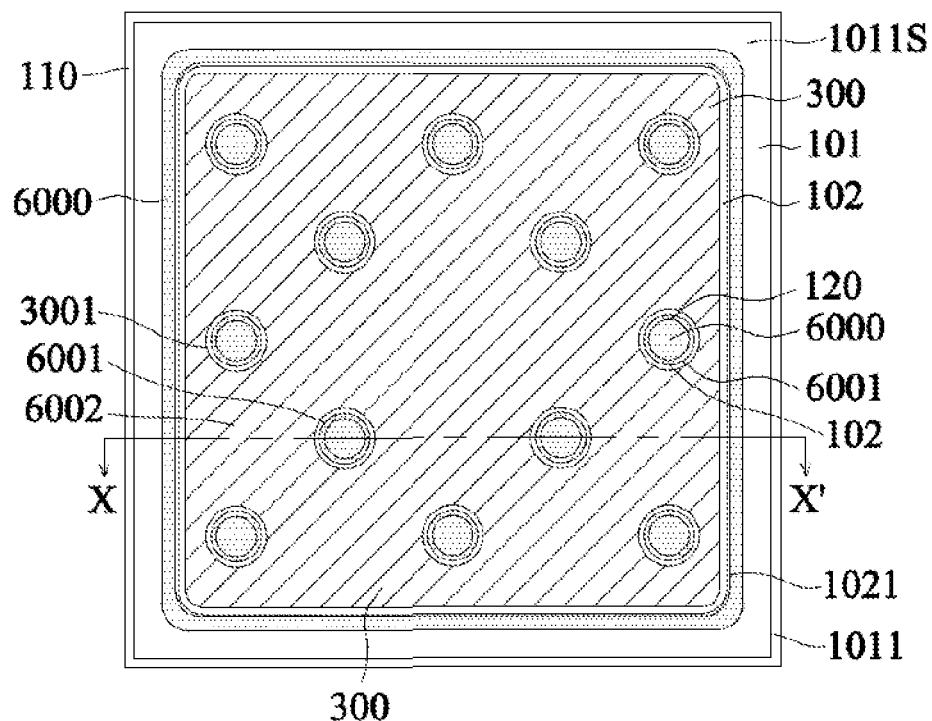
Figure 15B:
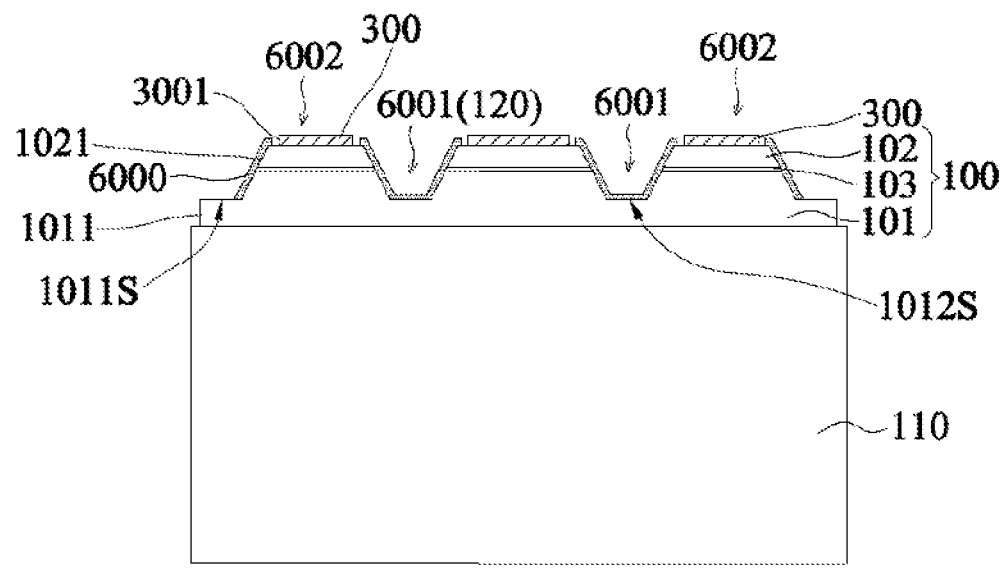

Referring to FIG. 15A and FIG. 15B, a transparent conductive layer 300 is formed on the second semiconductor layer 102 except for the first group of first insulating regions 6001. In other words, the transparent conductive layer 300 is only formed in the second group of first insulating openings 6002 and directly contacts the second semiconductor layer 102. A periphery 3001 of the transparent conductive layer 300 does not contact the first insulating layer 6000. The transparent conductive layer 300 includes a transparent conductive oxide film, such as indium tin oxide (ITO), or a thin metal film, such as silver (Ag) or aluminum (Al). The transparent conductive layer 300 can be configured to form an ohmic contact with the second semiconductor layer 102. The transparent conductive layer 300 includes a single layer or multiple layers.

Figure 16A:
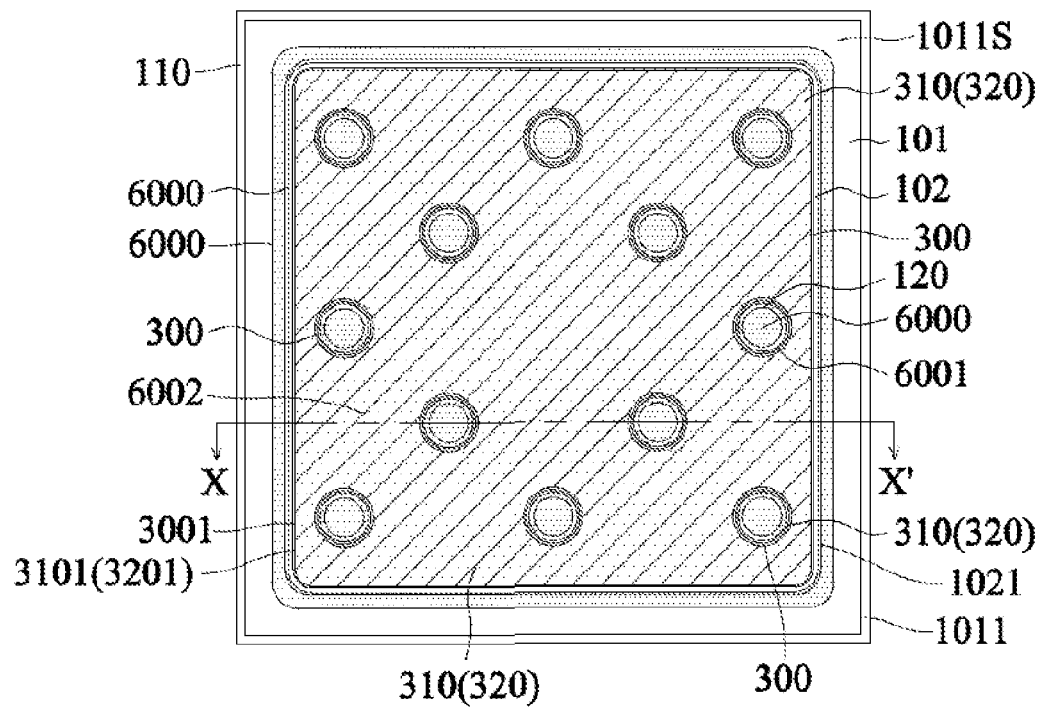
Figure 16B:
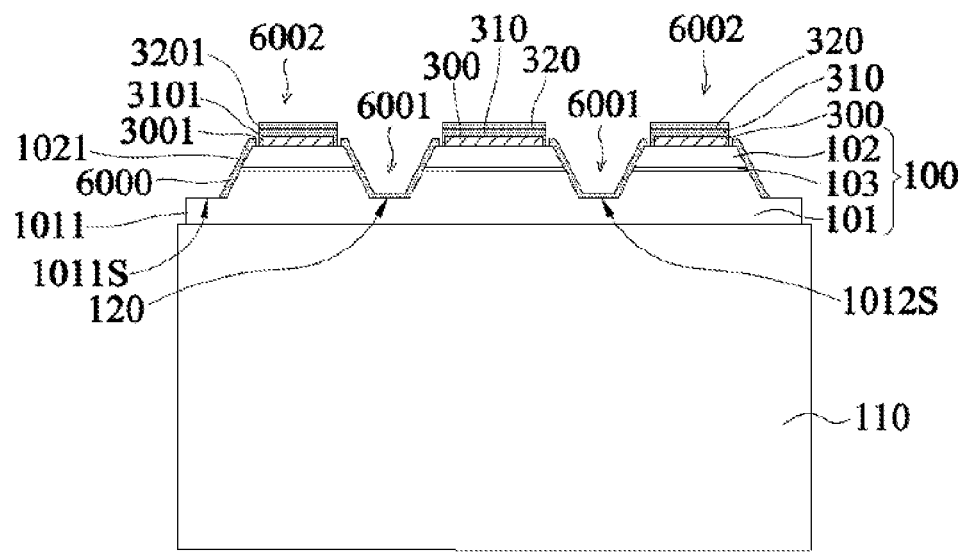

Referring to FIG. 16A and FIG. 16B, a reflective layer 310 is formed on the second semiconductor layer 102 except for the first group of first insulating regions 6001, and a barrier layer 320 is formed on the reflective layer 310 except for the first group of first insulating regions 6001. In other words, the reflective layer 310 and the barrier layer 320 are only formed in the second group of first insulating openings 6002. A periphery 3101 of the reflective layer 310 can be aligned with the periphery 3001 of the transparent conductive layer 300 or be formed outside of the periphery 3001 of the transparent conductive layer 300. A periphery 3201 of the barrier layer 320 can be aligned with the periphery 3101 of the reflective layer 310 or be formed outside of the periphery 3101 of the reflective layer 310. When the periphery 3201 of the barrier layer 320 is formed outside the periphery 3101 of the reflective layer 310, the reflective layer 310 is covered by the barrier layer 320, and the barrier layer 320 contacts the second semiconductor layer 102. Both the periphery 3201 of the barrier layer 320 and the periphery 3101 of the reflective layer 310 are separated from the first insulating layer 6000. The reflective layer 310 can comprise a single layer structure or a multi-layer structure, and the material of the reflective layer 310 includes metal material with high reflectivity, such as silver (Ag), gold (Au), aluminum (Al), titanium (Ti), chromium (Cr), copper (Cu), nickel (Ni), platinum (Pt), or an alloy thereof. The barrier layer 320 can comprise a single layer structure or a multi-layer structure, and the material of the barrier layer 320 includes Cr, Pt, Ti, TiW, W, or Zn. When the barrier layer 320 is a multi-layer structure, the barrier layer 320 is alternately stacked by a first barrier layer (not shown) and a second barrier layer (not shown), for example, Cr/Pt, Cr/Ti, Cr/TW, Cr/W, Cr/Zn, Ti/Pt, Ti/W, Ti/TiW, Ti/W, Ti/Zn, Pt/TiW, Pt/W, Pt/Zn, TiW/W, TiW/Zn, or W/Zn.

Figure 17A:
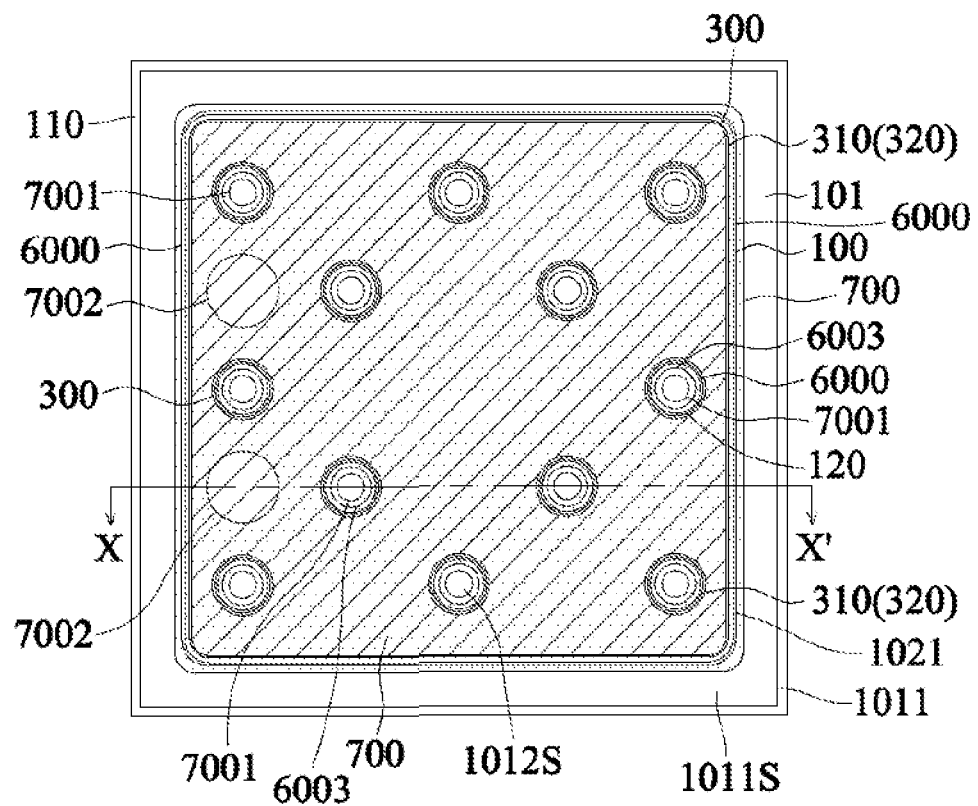
Figure 17B:
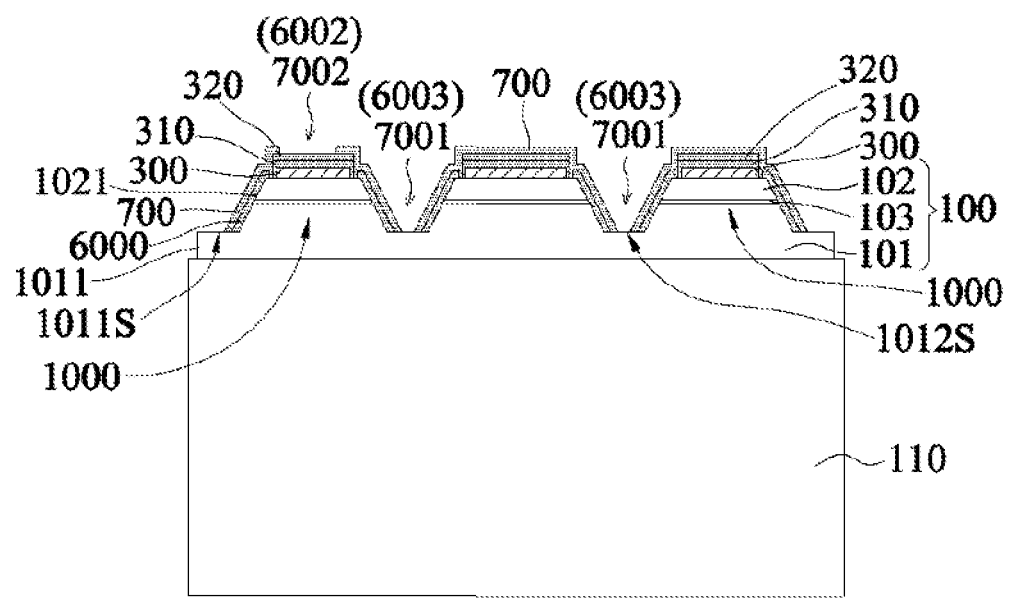

Referring to FIG. 17A and FIG. 17B, a second insulating layer 700 is formed to continuously cover the upper part and the inclined sidewalls 1021 of the one or the plurality of semiconductor constructions 1000. The second insulating layer 700 includes a first group of second insulating openings 7001 respectively corresponding to the plurality of vias 120, wherein the first group of first insulating regions 6001 of the first insulating layer 6000 formed in the plurality of vias 120 is partially removed to form a plurality of first insulating openings 6003 by etching at the step of forming the first group of second insulating openings 7001, and the first group of second insulating openings 7001 and the plurality of first insulating openings 6003 expose the surface 1012S of the first semiconductor layer 101. The second insulating layer 700 further includes a second group of second insulating openings 7002 formed on the upper part of part of the plurality of semiconductor constructions 1000 to expose the barrier layer 320 and/or the reflective layer 310. The second insulating layer 700 includes a single layer or multiple layers, such as a silicon oxide or silicon nitride film. Alternatively, the second insulating layer 700 includes a distributed Bragg reflector, which is formed by alternately stacking insulation layers having different refraction indices. For example, the second insulating layer 700 can be formed by alternately stacking $SiO_x/TiO_x$.

Figure 18A:
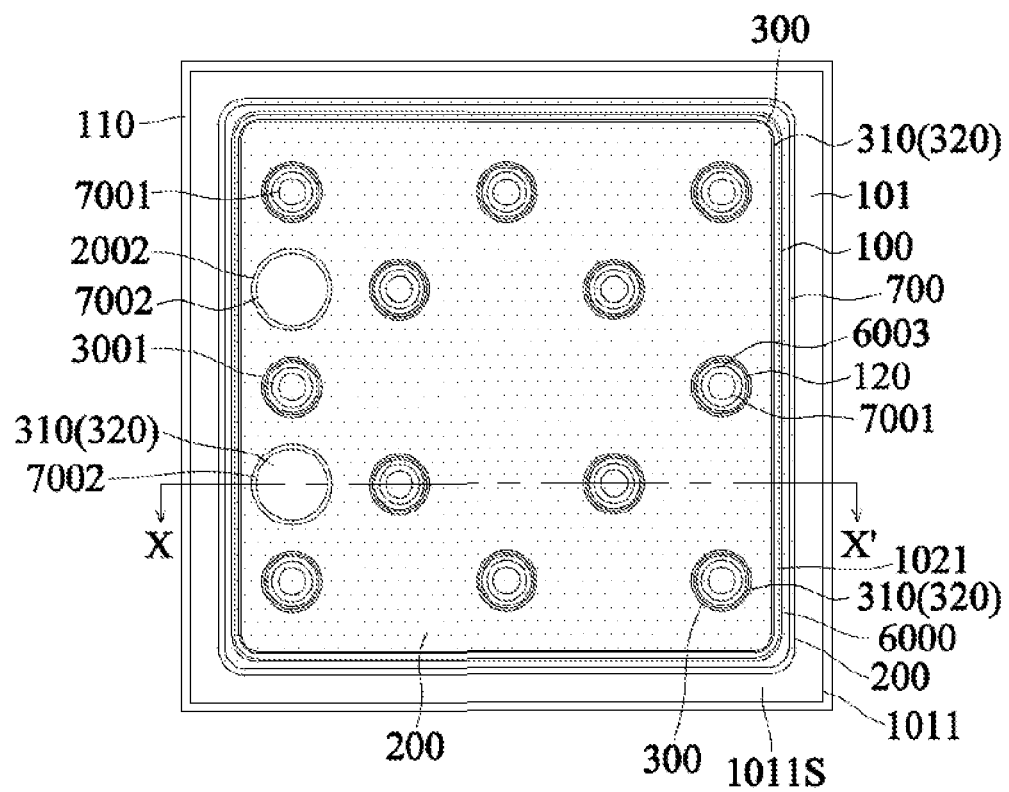
Figure 18B:
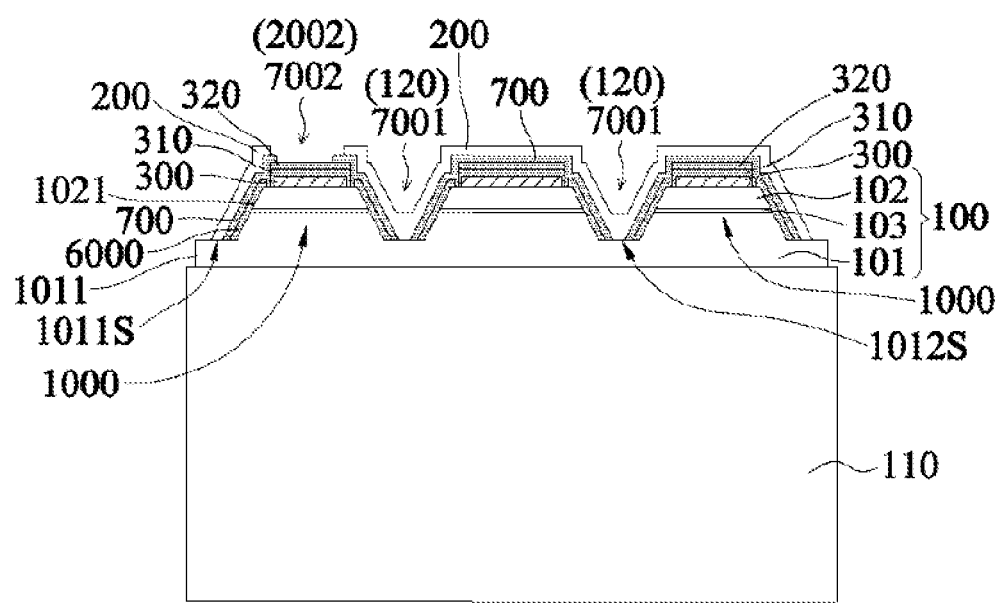

Referring to FIG. 18A and FIG. 18B, a metal layer 200 is formed to cover the one or the plurality of semiconductor constructions 1000 and the plurality of vias 120, except for regions corresponding to the second group of second insulating openings 7002. Specifically, the metal layer 200 is formed to continuously cover the upper part and the inclined sidewalls 1021 of the one or the plurality of semiconductor constructions 1000, the plurality of vias 120, and the periphery surface 1011S of the first semiconductor layer 101. The patterned metal layer 200 comprises one or more opening 2002 to expose the reflective layer 310 and/or the barrier layer 320, wherein a position of the one or more opening 2002 is corresponding to that of the second group of second insulating openings 7002.

Figure 19A:
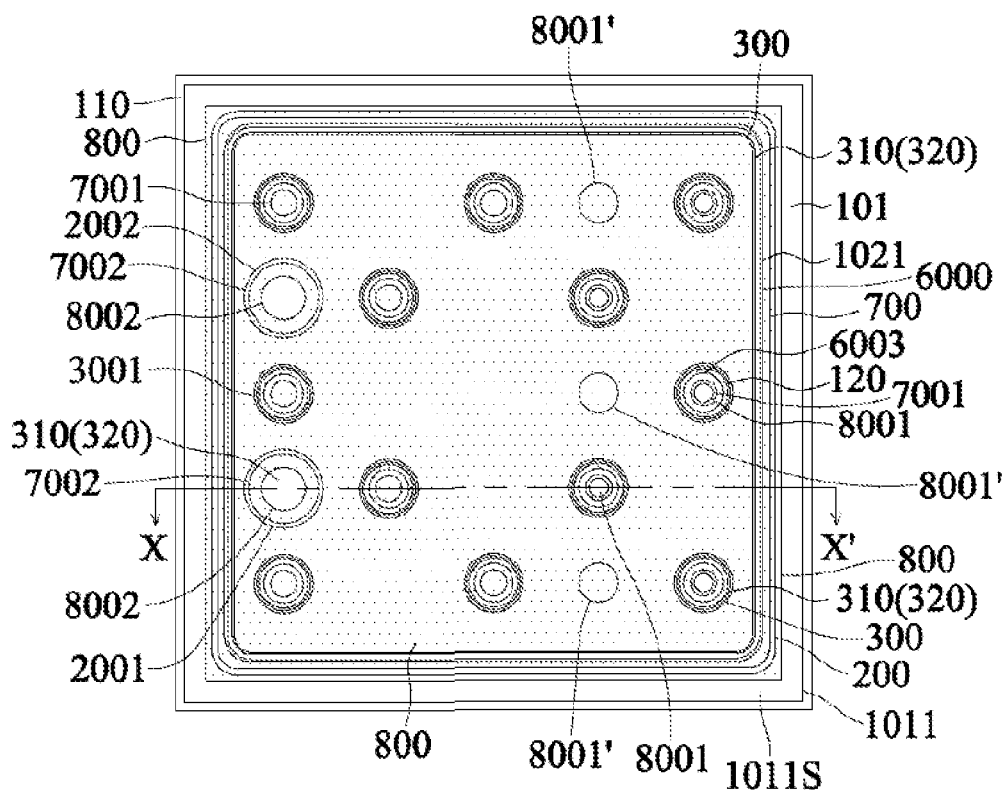
Figure 19B:
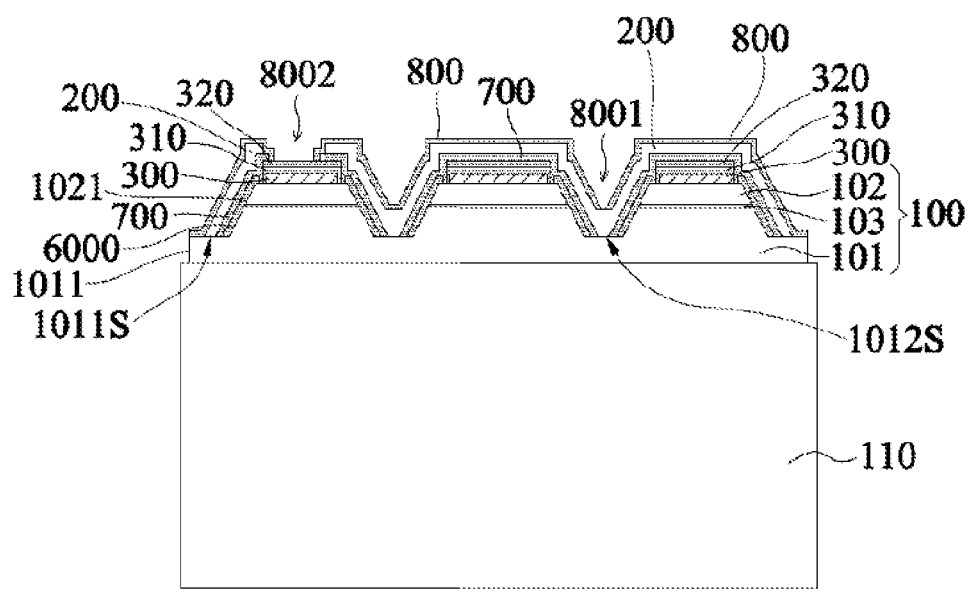

Referring to FIG. 19A and FIG. 19B, a third insulating layer 800 is formed to continuously cover the upper part and the inclined sidewalls 1021 of the one or the plurality of semiconductor constructions 1000, and the plurality of vias 120. The third insulating layer 800 includes one or a first group of third insulating openings 8001 formed on the first metal layer 200 at regions corresponding to part of the plurality of vias 120, wherein the one or the first group of third insulating openings 8001 exposes the first metal layer 200. In other words, the one or the first group of third insulating openings 8001 and part of the plurality of vias 120 are overlapped. In another example of the embodiment, the one or the first group of third insulating openings 8001 is formed on the first metal layer 200 except for regions corresponding to the plurality of vias 120. In other words, the one or the first group of third insulating openings 8001' and the plurality of vias 120 are not overlapped as shown in FIG. 19A. The third insulating layer 800 further includes one or a second group of third insulating openings 8002 respectively corresponding to the one or the second group of second insulating openings 7002, wherein the one or the second group of third insulating openings 8002 expose the barrier layer 320 and/or the reflective layer 310. The third insulating layer 800 includes a single layer or multiple layers, such as a silicon oxide or silicon nitride film. Alternatively, the third insulating layer 800 includes a distributed Bragg reflector, which is formed by alternately stacking insulation layers having different refraction indices. For example, the third insulating layer 800 can be formed by alternately stacking $SiO_x/TiO_x$.

Figure 20A:
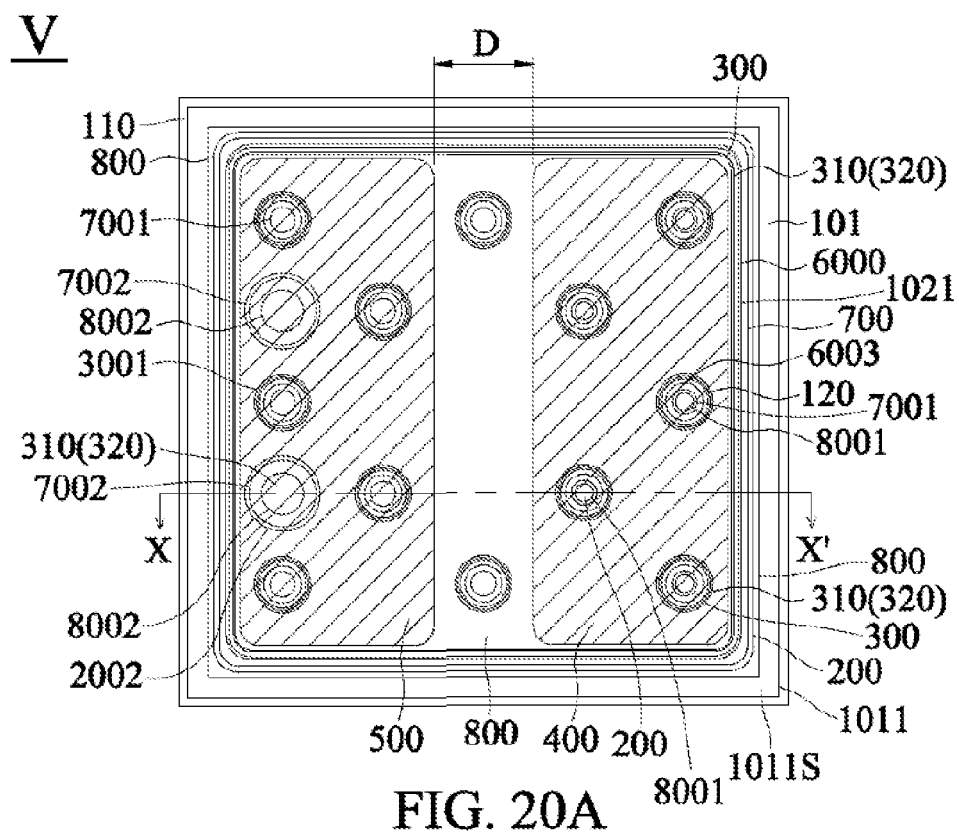
Figure 20B:
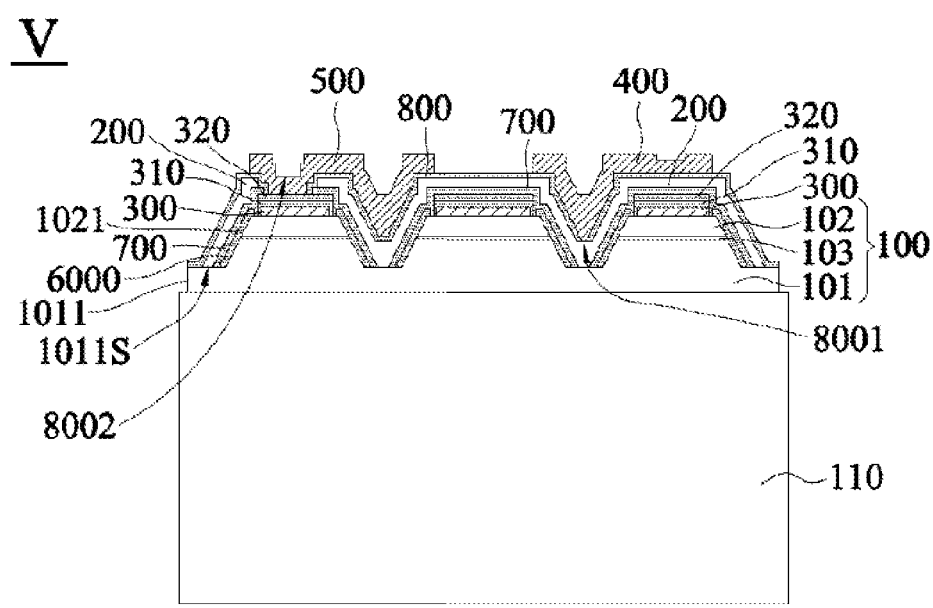

Referring to FIG. 20A and FIG. 20B, a first pad portion 400 and a second pad portion 500 are formed on the third insulating layer 800. The first pad portion 400 is separated from the second pad portion 500 with a shortest distance D larger than 30 μm, preferable a space between the first pad portion 400 and the second pad portion 500 is between 50 μm and 250 μm. The first pad portion 400 is connected to the first metal layer 200 through the one or the first group of third insulating openings 8001, and the second pad portion 500 is connected to the reflective layer 310 and/or the barrier layer 320 through the one or the second group of third insulating openings 8002.

Figure 21:
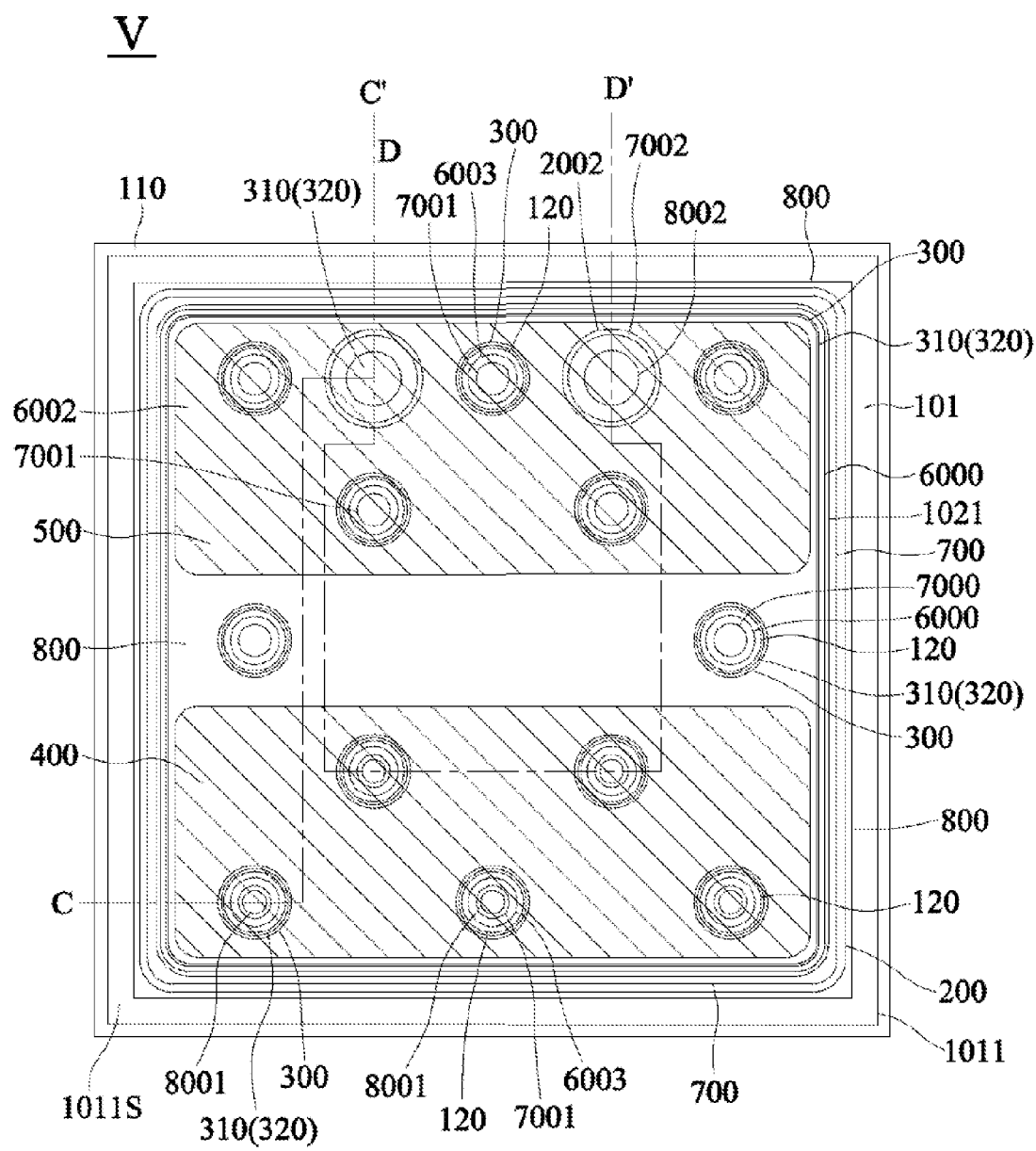
FIG. 21 illustrates a top view of the semiconductor light-emitting device V in accordance with an embodiment of the present application.
Figure 22:
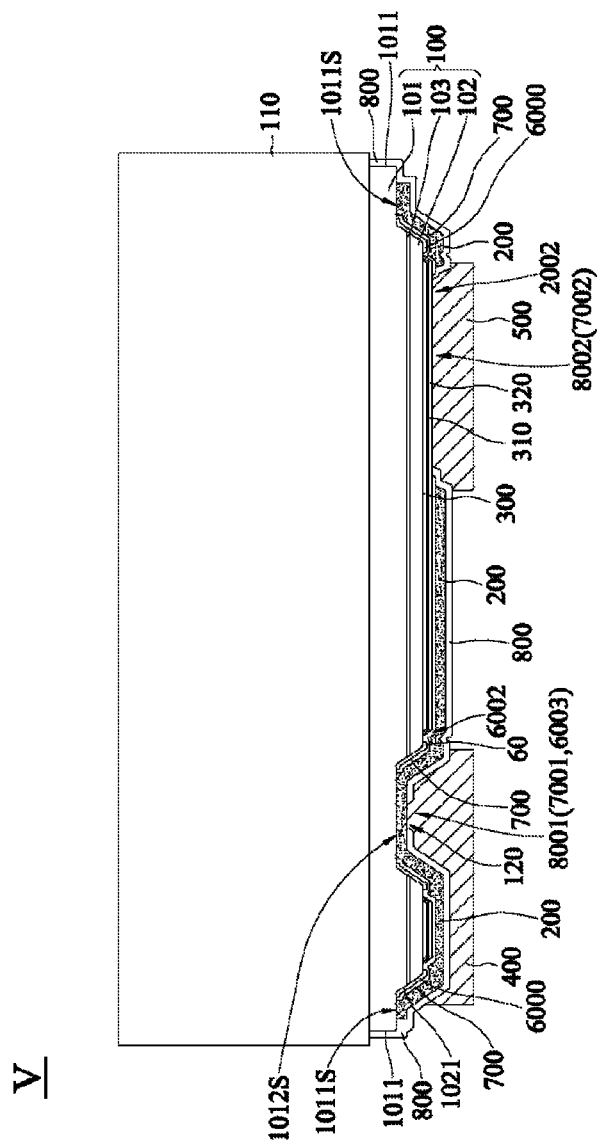
FIG. 22 illustrates a cross-sectional view of the semiconductor light-emitting device V along line C-C' of FIG. 21.
Figure 23:
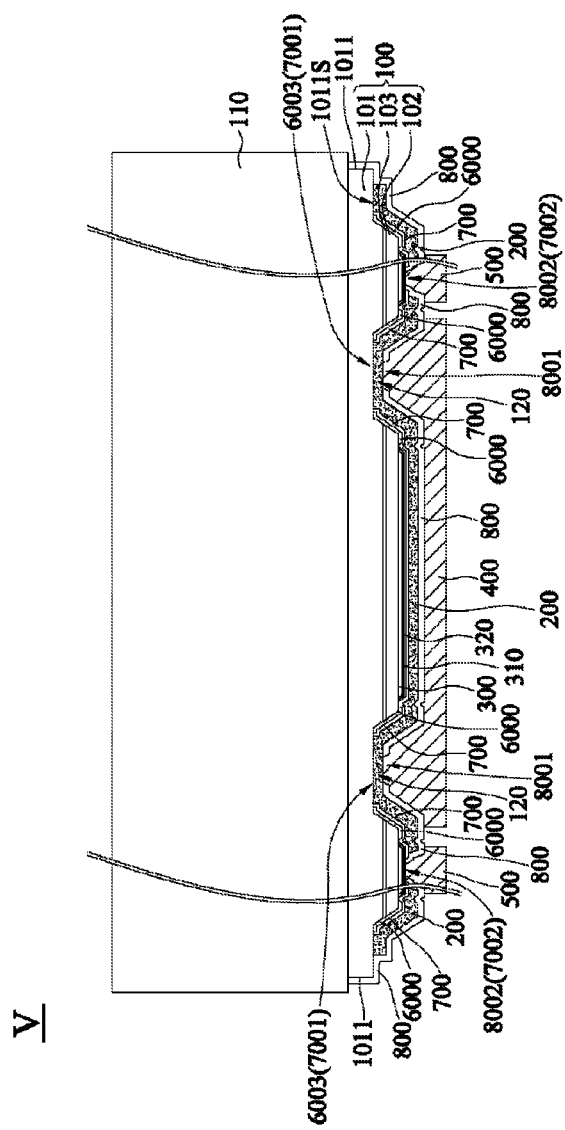
FIG. 23 illustrates a cross-sectional view of the semiconductor light-emitting device V along line D-D' of FIG. 21.

FIG. 21 illustrates a top view of the semiconductor light-emitting device V in accordance with an embodiment of the present application; FIG. 22 illustrates a cross-sectional view along line C-C' of FIG. 21; and FIG. 23 illustrates a cross-sectional view along line D-D' of FIG. 21. The semiconductor light-emitting device V is a flip chip type light-emitting diode device. As shown in FIG. 22 and FIG. 23, the semiconductor light-emitting device V includes a substrate 110, a semiconductor stack 100 formed on the substrate 110. the semiconductor stack 100 includes a first semiconductor layer 101, a second semiconductor layer 102, and an active layer 103 formed between the first semiconductor layer 101 and the second semiconductor layer 102. In an example of the embodiment, the substrate 110 can be a growth substrate of the semiconductor stack 100, and the material of the substrate 110 includes gallium arsenide (GaAs), gallium phosphide (GaP), gallium nitride (GaN), sapphire, silicon carbide (SiC), diamond, glass, quartz, acrylic, zinc oxide (ZnO), or aluminum nitride (AlN). In another example of the embodiment, the substrate 110 can be a support substrate, which is boned to the semiconductor stack 100 through adhesive materials including organic material, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, or fluorocarbon polymer; inorganic materials, such as silicone, or glass; or dielectric materials, such as aluminum oxide ($Al_2O_3$), silicon nitride ($SiN_x$), silicon oxide ($SiO_2$), titanium oxide ($TiO_2$), or magnesium fluoride ($MgF_2$). The first semiconductor layer 101 and the second semiconductor layer 102, such as cladding layers, or confinement layers, comprise different conductivity types, electricity, polarity, or dopant elements to provide electrons and holes. The active layer 103 is formed between the first semiconductor layer 101 and the second semiconductor layer 102, so the electrons and the holes combine in the active layer 103 under an electrical current to convert electrical energy to optical energy for emitting a light. The dominant wavelength of the light is adjusted by changing physical and chemical compositions of one or more layers in the semiconductor stack 100. The material of the semiconductor stack 100 includes group III-V semiconductor materials, such as $Al_xIn_yGa_{(1-x-y)}N$ or $Al_xIn_yGa_{(1-x-y)}P$, wherein $0 \leq x$, $y \leq 1$; $(x+y) \leq 1$. In accordance with the material of the active layer 103, the semiconductor stack 100 can emit a red light with a dominant wavelength between such as 610 nm and 650 nm, a green light with a dominant wavelength between such as 530 nm and 570 nm, a blue light with a dominant wavelength between such as 450 nm and 490 nm, or a UV light with a dominant wavelength between such as 230 nm and 400 nm. The active layer 103 includes single heterostructure (SH), double heterostructure (DH), double-side double heterostructure (DDH), or multi-quantum well (MQW) structure. The material of the active layer 103 includes i-type, p-type, or n-type semiconductor.

Part of the active layer 103 and the second semiconductor layer 102 away from an outer periphery 1011 of the semiconductor stack 100 are removed to form a plurality of vias 120. The plurality of vias 120 penetrates the semiconductor stack 100 to expose the surface 1012S of the first semiconductor layer 101. Another part of the active layer 103 and the second semiconductor layer 102 near the outer periphery 1011 of the semiconductor stack 100 are removed to form a ring-like exposing periphery surface 1011S of the first semiconductor layer 101, wherein the ring-like exposing periphery surface 1011S is along an outer periphery of the semiconductor light-emitting device V. In other words, the ring-like exposing periphery surface 1011S surrounds the active layer 103 and the second semiconductor layer 102. In an example of the embodiment, the plurality of vias 120 is arranged into a plurality of rows. The plurality of vias 120 disposed on adjacent two rows can be aligned or staggered. Each of the plurality of vias 120 includes a shape, such as circle, ellipse, or finger in top view of the semiconductor light-emitting device V. The method for forming the plurality of vias 120 includes wet etching or dry etching.

A first insulating layer 6000 is deposited on the semiconductor stack 100 to surround the active layer 103 to protect the epitaxial quality of the active layer 103 from being damaged by the following process. The first insulating layer 6000 is patterned by lithography technique to provide a plurality of first insulating openings 6002, 6003 on the semiconductor stack 100. As shown in FIG. 22, the plurality of first insulating openings 6002, 6003 of the first insulating layer 6000 respectively exposes the second semiconductor layer 102 and the first semiconductor layer 101.

A transparent conductive layer 300 is formed on the first insulating opening 6002 provided on the second semiconductor layer 102. The transparent conductive layer 300 is electrically connected to the semiconductor stack 100 when the electrical current is injected. The material of the transparent conductive layer 300 includes transparent material which is transparent to the light emitted from the active layer 103. The structure of the transparent conductive layer 300 can be one or more layers.

A reflective layer 310 is formed on the second semiconductor layer 102 for increasing the light extraction efficiency of the semiconductor light-emitting device V, and a barrier layer 320 is formed on the reflective layer 310 for protecting the reflective layer 310 and preventing the metal element of the reflective layer 310 diffusing out. In an example of the embodiment, the reflective layer 310 directly contacts the second semiconductor layer 102. In an example of the embodiment, the reflective layer 310 directly contacts the transparent conductive layer 300. A sidewall of the barrier layer 320 can be aligned with a sidewall of the reflective layer 310 or extend to outside of a sidewall of the reflective layer 310. When the sidewall of the barrier layer 320 is formed beyond the sidewall of the reflective layer 310, the reflective layer 310 is covered by the barrier layer 320, and part of the barrier layer 320 directly contacts the second semiconductor layer 102 or the transparent conductive layer 300. The reflective layer 310 can include a single layer structure or a multi-layer structure, and the material of the reflective layer 310 includes metal material with high reflectivity, such as silver (Ag), gold (Au), aluminum (Al), titanium (Ti), chromium (Cr), copper (Cu), nickel (Ni), platinum (Pt), or an alloy thereof. The barrier layer 320 can include a single layer structure or a multi-layer structure, and the material of the barrier layer 320 includes Cr, Pt, Ti, TiW, W, or Zn. When the barrier layer 320 is a multi-layer structure, the barrier layer 320 is alternately stacked by a first barrier layer (not shown) and a second barrier layer (not shown), for example, Cr/Pt, Cr/Ti, Cr/TW, Cr/W, Cr/Zn, Ti/Pt, Ti/W, Ti/TiW, Ti/W, Ti/Zn, Pt/TiW, Pt/W, Pt/Zn, TiW/W, TiW/Zn, or W/Zn.

A second insulating layer 700 is deposited on the semiconductor stack 100 to surround the active layer 103. The second insulating layer 700 is patterned by lithography technique to provide a first group of second insulating openings 7001 and a second group of second insulating openings 7002 on the semiconductor stack 100. As shown in FIG. 22 and FIG. 23, the first group of second insulating openings 7001 of the second insulating layer 700 exposes the first semiconductor layer 101, and the second group of second insulating openings 7002 of the second insulating layer 700 exposes the barrier layer 320. In an example of the embodiment, the first group of second insulating openings 7001 includes a width different from that of the second group of second insulating openings 7002. In another example of the embodiment, a number of the first group of second insulating openings 7001 is different from that of the second group of second insulating openings 7002. In another example of the embodiment, the second group of second insulating openings 7002 is only formed on one side of the semiconductor stack 100 from a top view of the semiconductor light-emitting device V. In another example of the embodiment, a position of the first group of second insulating openings 7001 is respectively corresponding to that of the plurality of vias 120.

A patterned metal layer 200 covers part of the second semiconductor layer 102, the plurality of vias 120, and the ring-like exposing periphery surface 1011S, except for regions corresponding to the second group of second insulating openings 7002 and the side wall of the outer periphery 1011 of the semiconductor light-emitting device V, wherein the ring-like exposing surface 1011S is formed along the outer periphery 1011 of the semiconductor light-emitting device V. Specifically, from a top view of the semiconductor light-emitting device V, the patterned metal layer 200 includes an area larger than that of the active layer 103. As shown in FIG. 22 and FIG. 23, part of the patterned metal layer 200 is formed on the transparent conductive layer 300, the reflective layer 310, or the barrier layer 320. The patterned metal layer 200 comprises one or more opening 2002 to expose the reflective layer 310 and/or the barrier layer 320.

In another embodiment, the patterned metal layer 200 covers part of the second semiconductor layer 102, the plurality of vias 120, covers the ring-like exposing periphery surface 1011S, and also extends to the side wall of the outer periphery 1011 of the semiconductor light-emitting device V which is the side wall of the first semiconductor layer 101. In another embodiment, similar to above embodiments, the patterned metal layer 200 can extend to the surface of the substrate 110 not covered by the first semiconductor layer 101. The patterned metal layer 200 can be a single layer structure or a multi-layer structure. The material of the patterned metal layer 200 includes metal such as Al, Cr, Pt, Ti, TiW, W, or Zn.

A third insulating layer 800 is deposited on the semiconductor stack 100. The third insulating layer 800 is patterned by lithography technique to provide a first group of third insulating openings 8001 and a second group of third insulating openings 8002 on the semiconductor stack 100. As shown in FIG. 22 and FIG. 23, the first group of third insulating openings 8001 of the third insulating layer 800 exposes the patterned metal layer 200. The second group of third insulating openings 8002 of the third insulating layer 800 exposes the transparent conductive layer 300, the reflective layer 310, or the barrier layer 320. In an example of the embodiment, the first group of third insulating openings 8001 and the second group of third insulating openings 8002 are formed on two sides of the semiconductor stack 100 from a top view of the semiconductor light-emitting device V. In another example of the embodiment, a number of the first group of third insulating openings 8001 is different from that of the second group of third insulating openings 8002.

The material of the first insulating layer 6000, the second insulating layer 700, and the third insulating layer 800 includes non-conductive material comprising organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, or fluorocarbon polymer; inorganic materials, such as silicone, or glass; or dielectric materials, such as aluminum oxide ($Al_2O_3$), silicon nitride ($SiN_x$), silicon oxide ($SiO_2$), titanium oxide ($TiO_2$), or magnesium fluoride ($MgF_2$). The first insulating layer 6000, the second insulating layer 700, and the third insulating layer 800 can be formed by printing, evaporation or sputtering.

A first pad portion 400 covers one portion of the plurality of vias 120 and electrically connected to the first semiconductor layer 101. A second pad portion 500 covers another portion of the plurality of vias 120 and electrically connected to the second semiconductor layer 102. The first pad portion 400 is electrically connected to the first semiconductor layer 101 through the first group of third insulating opening 8001 of the third insulating layer 800, and the second pad portion 500 is electrically connected to the second semiconductor layer 102 through the second group of third insulating opening 8002 of the third insulating layer 800 and the opening 2002 of the patterned metal layer 200. The material of the first pad portion 400 and the second pad portion 500 includes titanium (Ti), platinum (Pt), nickel (Ni), tin (Sn), gold (Au), or an alloy thereof. An area of the first pad portion 400 can be the same as or different from that of the second pad portion 500.

Figure 5:
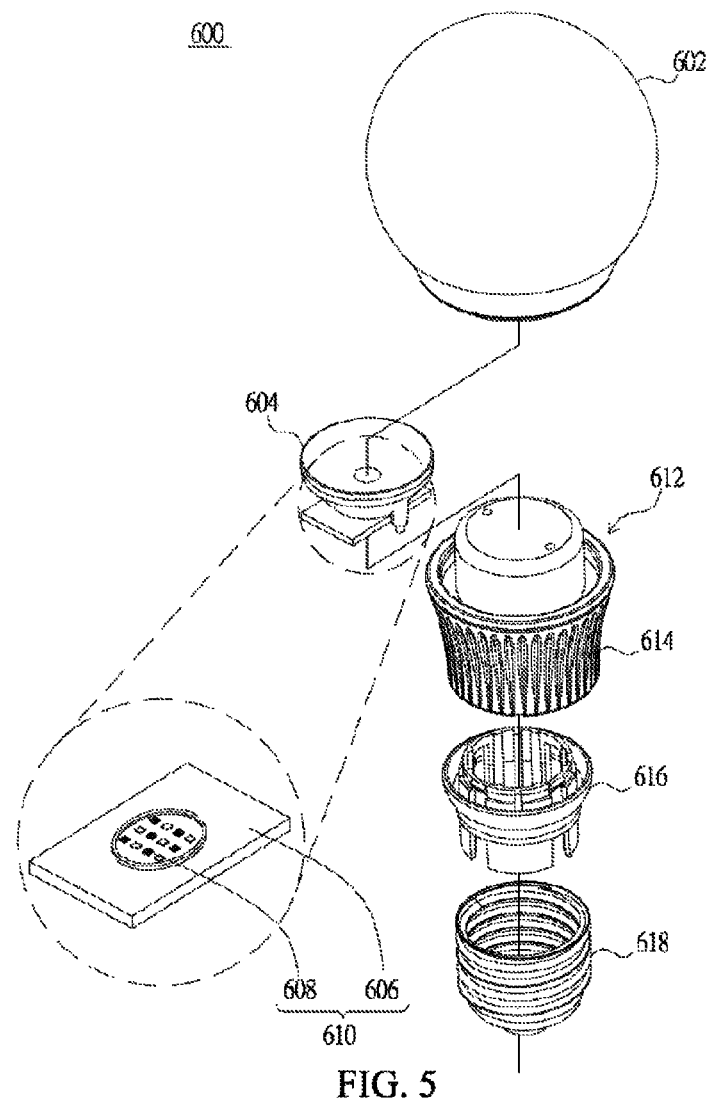
FIG. 5 illustrates a structure diagram in accordance with another embodiment of the present application.
Figure 6:
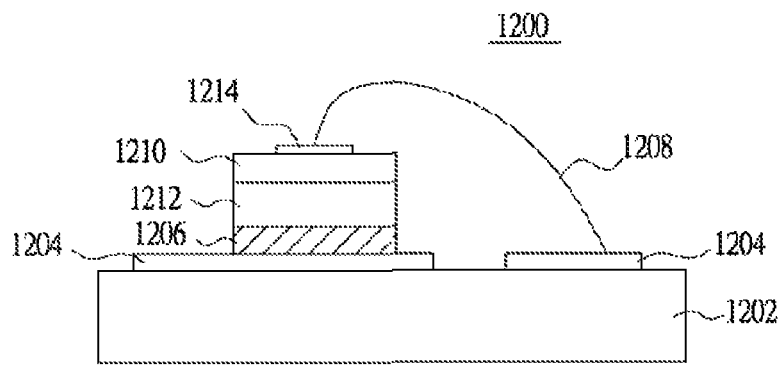
FIG. 6 illustrates a structure diagram of a conventional light-emitting apparatus.
Figure 7:
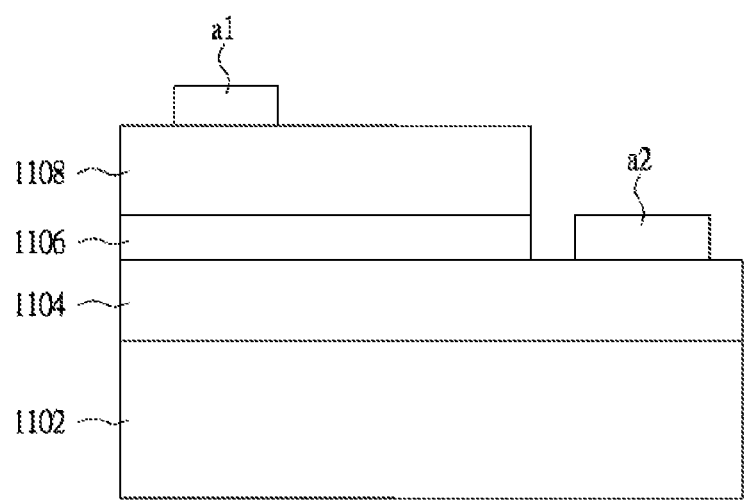
FIG. 7 illustrates a cross-sectional view of a conventional LED.

FIG. 5 illustrates a structure diagram in accordance with another embodiment of the present application. A light bulb 600 includes an envelope 602, a lens 604, a light-emitting module 610, a base 612, a heat sink 614, a connector 616 and an electrical connecting device. The light-emitting module 610 includes a submount 60 and a plurality of light-emitting devices 608, which is described in above embodiments, formed on the submount 606.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A semiconductor light-emitting device, comprising:
a semiconductor stack comprising a first semiconductor layer, a second semiconductor layer, and an active layer between the first semiconductor layer and the second semiconductor layer, wherein the first semiconductor layer comprises a lateral outer perimeter surface surrounding the active layer;
a plurality of vias penetrating the semiconductor stack to expose the first semiconductor layer;
a patterned metal layer formed on the plurality of vias and covering the lateral outer perimeter surface of the first semiconductor layer;
a first pad portion formed on the semiconductor stack to electrically connected to the first semiconductor layer; and
a second pad portion formed on the semiconductor stack to electrically connected to the second semiconductor layer.

2. The semiconductor light-emitting device of claim 1, further comprising a first insulating layer surrounding the active layer.

3. The semiconductor light-emitting device of claim 1, wherein the patterned metal layer comprises an opening formed on the second semiconductor layer, and the second pad portion is electrically connected to the second semiconductor layer through the opening.

4. The semiconductor light-emitting device of claim 1, further comprising a transparent conductive layer formed on the second semiconductor layer.

5. The semiconductor light-emitting device of claim 1, further comprising a reflective layer formed on the second semiconductor layer; and a barrier layer formed on the reflective layer, wherein the reflective layer comprises a single layer structure, and the barrier layer comprises a multi-layer structure.

6. The semiconductor light-emitting device of claim 5, wherein a sidewall of the barrier layer is formed outside of a sidewall of the reflective layer.

7. The semiconductor light-emitting device of claim 5, further comprising a second insulating layer formed on the semiconductor stack and comprising a second insulating opening to expose the barrier layer and the first semiconductor layer.

8. The semiconductor light-emitting device of claim 5, wherein part of the patterned metal layer is formed on the reflective layer.

9. The semiconductor light-emitting device of claim 5, further comprising a third insulating layer formed on the patterned metal layer and comprising a plurality of third insulating openings to expose the patterned metal layer and the barrier layer.

10. A semiconductor light-emitting device having an outer perimeter, comprising:
a semiconductor stack comprising a first semiconductor layer, a second semiconductor layer, and an active layer between the first semiconductor layer and the second semiconductor layer, wherein the semiconductor stack comprises an inclined sidewall, the first semiconductor layer comprises a lateral outer perimeter surface formed along the outer perimeter of the semiconductor light-emitting device; and
a patterned metal layer covering the inclined sidewall of the semiconductor stack and the lateral outer perimeter surface of the first semiconductor layer, wherein the patterned metal layer comprises a perimeter larger than that of the active layer.

11. The semiconductor light-emitting device of claim 10, further comprising a first insulating layer surrounding the active layer.

12. The semiconductor light-emitting device of claim 10, further comprising a transparent conductive layer formed on the second semiconductor layer.

13. The semiconductor light-emitting device of claim 10, further comprising a reflective layer formed on the second semiconductor layer; and a barrier layer formed on the reflective layer, wherein the reflective layer comprises a single layer structure, and the barrier layer comprises a multi-layer structure.

14. The semiconductor light-emitting device of claim 13, wherein a sidewall of the barrier layer is formed outside of a sidewall of the reflective layer.

15. The semiconductor light-emitting device of claim 13, further comprising a second insulating layer formed on the barrier layer and comprising a second opening to accommodate part of the patterned metal layer.

16. The semiconductor light-emitting device of claim 13, wherein part of the patterned metal layer is formed on the reflective layer.

17. The semiconductor light-emitting device of claim 10, further comprising a first pad portion and a second pad portion.

18. The semiconductor light-emitting device of claim 17, further comprising a third insulating layer comprising a first opening and a second opening to expose the patterned metal layer, wherein the first pad portion is electrically connected to the first semiconductor layer through the first opening of the third insulating layer, and the second pad portion is electrically connected to the second semiconductor layer through the second opening of the third insulating layer.

19. The semiconductor light-emitting device of claim 10, further comprising a plurality of vias penetrating the semiconductor stack to expose the first semiconductor layer, wherein the patterned metal layer is formed on the plurality of vias.

20. The semiconductor light-emitting device of claim 5, further comprising a third insulating layer formed on the patterned metal layer and comprising a third insulating opening to expose the patterned metal layer and the barrier layer.

* * * * *